(12) United States Patent
Niewmierzycki

(10) Patent No.: US 9,493,306 B2
(45) Date of Patent: Nov. 15, 2016

(54) LOW COST HIGH THROUGHPUT PROCESSING PLATFORM

(71) Applicant: Mattson Technology, Inc., Fremont, CA (US)

(72) Inventor: Leszek Niewmierzycki, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 367 days.

(21) Appl. No.: 14/173,400

(22) Filed: Feb. 5, 2014

(65) Prior Publication Data

US 2014/0151195 A1 Jun. 5, 2014

Related U.S. Application Data

(62) Division of application No. 10/919,582, filed on Aug. 17, 2004, now Pat. No. 8,668,422.

(51) Int. Cl.
| | |
|---|---|
| *F16H 7/00* | (2006.01) |
| *B65G 15/12* | (2006.01) |
| *H01L 21/677* | (2006.01) |
| *H01L 21/687* | (2006.01) |

(52) U.S. Cl.
CPC ......... *B65G 15/12* (2013.01); *H01L 21/67742* (2013.01); *H01L 21/67766* (2013.01); *H01L 21/68707* (2013.01); *Y10S 414/135* (2013.01); *Y10S 414/139* (2013.01)

(58) Field of Classification Search
CPC .............. F16H 7/023; F16H 7/02; F16G 1/28; F05B 2260/4021; F03D 15/00

USPC ................................................... 474/148, 84
See application file for complete search history.

(56) References Cited

U.S. PATENT DOCUMENTS

| 169,380 | A | * | 11/1875 | Smith | ...................... | F16H 7/02 |
| | | | | | | 474/88 |
| 204,969 | A | * | 6/1878 | Hall | ......................... | F16H 7/02 |
| | | | | | | 474/87 |
| 687,146 | A | * | 11/1901 | Fleckenstein | ........... | F16H 27/04 |
| | | | | | | 474/139 |
| 847,440 | A | * | 3/1907 | Rivett | ...................... | F16H 7/02 |
| | | | | | | 474/88 |

(Continued)

*Primary Examiner* — Henry Liu
(74) *Attorney, Agent, or Firm* — Pritzkau Patent Group, LLC

(57) ABSTRACT

As part of a system for processing workpieces, a workpiece support arrangement, separate from a process chamber arrangement supports at least two workpieces at least generally in a stacked relationship to form a workpiece column. A transfer arrangement transports at least two of the workpieces between the workpiece column and the process chamber arrangement by simultaneously moving the two workpieces at least generally along first and second transfer paths, respectively, that are defined between the workpiece column and the first and second process stations. The transfer arrangement can simultaneously move untreated and treated workpieces. Vertical motion swing arms and coaxial swing arms are described. A pair of spaced apart swing arms, the workpiece column and the processing stations can cooperatively define a pentagonal shape. Timing belt backlash elimination, a dual degree of freedom slot valve and low point chamber pumping, for removing chamber contaminants, are also described.

6 Claims, 33 Drawing Sheets

(56) References Cited

U.S. PATENT DOCUMENTS

| | | | |
|---|---|---|---|
| 1,072,834 A * | 9/1913 | Devlin | F16H 9/26 474/84 |
| 2,058,500 A * | 10/1936 | Plucker | F03D 7/0252 290/55 |
| 2,214,541 A * | 9/1940 | Siegling | F16H 7/02 474/100 |
| 2,507,852 A * | 5/1950 | Case | B29D 29/08 156/140 |
| 2,664,758 A * | 1/1954 | Smits | G11B 19/20 112/220 |
| 2,775,131 A * | 12/1956 | Smits | G11B 19/27 474/113 |
| 3,125,232 A | 3/1964 | Brinkman et al. | |
| 3,260,125 A * | 7/1966 | Dolza | F16H 7/023 474/148 |
| 3,534,634 A * | 10/1970 | Shunpei | F16H 7/14 474/115 |
| 3,597,985 A * | 8/1971 | Jeffrey | F16H 7/06 474/148 |
| 3,822,485 A * | 7/1974 | Bates | D06C 7/00 165/89 |
| 4,006,925 A * | 2/1977 | Scherer | F03D 7/0224 290/80 R |
| 4,047,444 A * | 9/1977 | Jeffrey | F16H 7/023 474/148 |
| 4,147,069 A * | 4/1979 | Derner | F16G 1/28 474/204 |
| RE30,440 E * | 12/1980 | Jeffrey | F16H 7/023 474/148 |
| 4,293,295 A * | 10/1981 | van Deuren | B30B 11/201 425/314 |
| 4,373,988 A | 2/1983 | Bauser et al. | |
| 4,457,269 A * | 7/1984 | Beardmore | F01L 1/02 123/90.31 |
| 4,687,542 A | 8/1987 | Davis et al. | |
| 4,702,728 A * | 10/1987 | Williams | B23Q 5/04 474/148 |
| 4,787,259 A * | 11/1988 | Carson | F16H 19/003 74/10.7 |
| 4,836,733 A | 6/1989 | Hertel et al. | |
| 4,854,923 A * | 8/1989 | Sexton | A23G 9/045 192/108 |
| 4,885,946 A | 12/1989 | Balter | |
| 4,927,484 A | 5/1990 | Mitomi | |
| 5,011,366 A | 4/1991 | Miller | |
| 5,232,408 A * | 8/1993 | Brown | F16H 7/18 226/172 |
| 5,246,406 A * | 9/1993 | Vahabzadeh | F16G 13/04 474/101 |
| 5,314,386 A * | 5/1994 | Eide | F16H 7/14 474/150 |
| 5,385,508 A * | 1/1995 | Pietikainen | G01N 29/22 474/134 |
| 5,584,647 A | 12/1996 | Uehara et al. | |
| 5,662,541 A * | 9/1997 | Roovers | F16G 1/28 474/149 |
| 5,713,717 A | 2/1998 | Cho | |
| 5,765,444 A | 6/1998 | Bacchi et al. | |
| 5,944,857 A | 8/1999 | Edwards et al. | |
| 5,957,797 A * | 9/1999 | Hong | F16G 1/00 474/148 |
| 5,961,269 A | 10/1999 | Krocker | |
| 6,042,623 A | 3/2000 | Edwards | |
| 6,071,055 A | 6/2000 | Tepman | |
| 6,082,950 A | 7/2000 | Altwood et al. | |
| 6,095,741 A | 8/2000 | Krocker et al. | |
| 6,105,454 A | 8/2000 | Bacchi et al. | |
| 6,118,194 A * | 9/2000 | Kawamura | F02B 63/04 290/6 |
| 6,135,907 A * | 10/2000 | Hong | F16G 1/00 474/148 |
| 6,239,524 B1 * | 5/2001 | Leibowitz | H02K 7/1004 290/6 |
| 6,315,512 B1 | 11/2001 | Tabrizi et al. | |
| 6,318,945 B1 | 11/2001 | Hofmeister | |
| 6,350,097 B1 | 2/2002 | Mitchell et al. | |
| 6,395,094 B1 | 5/2002 | Tanaka et al. | |
| 6,429,139 B1 | 8/2002 | Ryan et al. | |
| 6,464,448 B1 | 10/2002 | Ha | |
| 6,537,415 B2 | 3/2003 | Kojima et al. | |
| 6,568,552 B1 | 5/2003 | Tabrizi et al. | |
| 6,568,896 B2 | 5/2003 | Franklin et al. | |
| 6,585,470 B2 | 7/2003 | Van Der Meulen | |
| 6,610,150 B1 | 8/2003 | Savage et al. | |
| 6,663,333 B2 | 12/2003 | Kinnard et al. | |
| 6,675,069 B2 | 1/2004 | Uratani | |
| 6,692,219 B2 | 2/2004 | Coomer et al. | |
| 6,707,190 B2 * | 3/2004 | Leibowitz | H02K 16/00 310/112 |
| 6,719,517 B2 | 4/2004 | Beaulieu et al. | |
| 6,737,826 B2 | 5/2004 | Gilchrist | |
| 6,748,293 B1 | 6/2004 | Larsen | |
| 6,755,092 B2 | 6/2004 | Wakabayashi et al. | |
| 6,893,204 B1 | 5/2005 | Suzuki et al. | |
| 7,191,866 B2 * | 3/2007 | Sasaki | B62D 5/0424 180/443 |
| 7,563,068 B2 * | 7/2009 | Niewmierzycki | H01L 21/67742 414/806 |
| 7,563,156 B2 * | 7/2009 | Anderson | B24B 7/186 451/353 |
| 7,658,586 B2 * | 2/2010 | Niewmierzycki | H01L 21/67742 414/217 |
| 7,850,562 B2 * | 12/2010 | DeGroot | B65G 15/26 198/411 |
| 8,163,214 B2 * | 4/2012 | Mol | B65G 15/42 264/167 |
| 8,668,422 B2 * | 3/2014 | Niewmierzycki | H01L 21/67742 414/217 |
| 9,017,194 B2 * | 4/2015 | Richardson | F16H 7/02 474/139 |
| 9,090,439 B2 * | 7/2015 | Tjensvoll | B66D 1/20 |
| 9,151,357 B2 * | 10/2015 | DeGroot | B65G 15/26 |
| 9,181,928 B2 * | 11/2015 | Tjensvoll | F03D 9/002 |
| 2002/0006323 A1 | 1/2002 | Yoshida et al. | |
| 2002/0033136 A1 | 3/2002 | Savage et al. | |
| 2002/0131848 A1 | 9/2002 | Kurata | |
| 2002/0137354 A1 | 9/2002 | Timperio et al. | |
| 2002/0159864 A1 | 10/2002 | Lowrance | |
| 2003/0035705 A1 | 2/2003 | Johnson | |
| 2003/0108415 A1 | 6/2003 | Hosek et al. | |
| 2003/0113187 A1 | 6/2003 | Lei et al. | |
| 2004/0013497 A1 | 1/2004 | Shirai | |
| 2004/0240971 A1 | 12/2004 | Tezuka et al. | |
| 2005/0209033 A1 * | 9/2005 | Ledvina | F01L 1/02 474/84 |
| 2005/0282670 A1 * | 12/2005 | Kim | B62J 13/04 474/144 |
| 2006/0135305 A1 * | 6/2006 | Erez | F16H 49/001 474/202 |
| 2006/0154766 A1 * | 7/2006 | Lacy | F02B 67/06 474/148 |
| 2006/0258128 A1 | 11/2006 | Nunan et al. | |
| 2007/0015617 A1 * | 1/2007 | Bertolotti | F03D 1/0658 474/85 |
| 2011/0030489 A1 * | 2/2011 | Chen | F16H 55/18 74/409 |
| 2011/0281677 A1 * | 11/2011 | Tjensvoll | F03D 9/002 474/148 |
| 2012/0152644 A1 * | 6/2012 | Kydd | B60K 6/48 180/366 |
| 2013/0029796 A1 * | 1/2013 | Tjensvoll | B66D 1/20 474/148 |
| 2013/0055858 A1 * | 3/2013 | Richardson | E21B 19/164 81/57.11 |
| 2014/0011617 A1 * | 1/2014 | Montag | B66C 23/84 474/148 |

\* cited by examiner

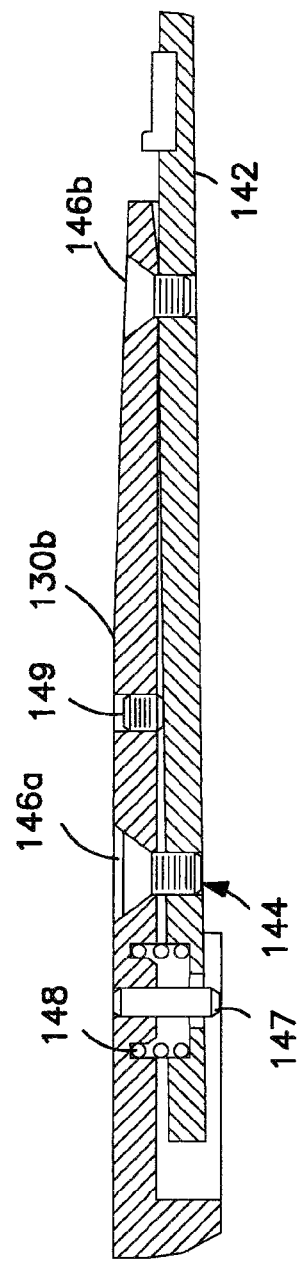

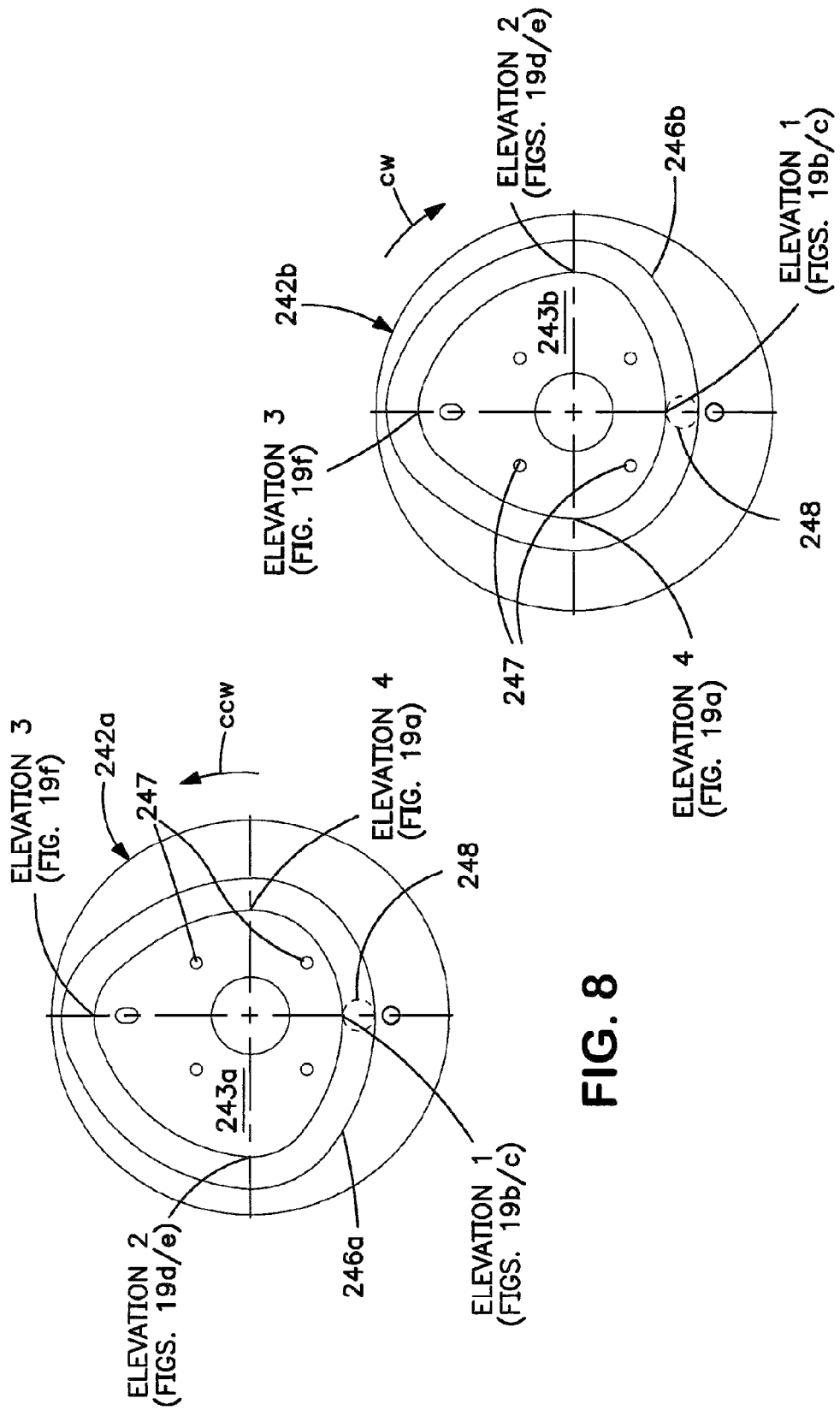

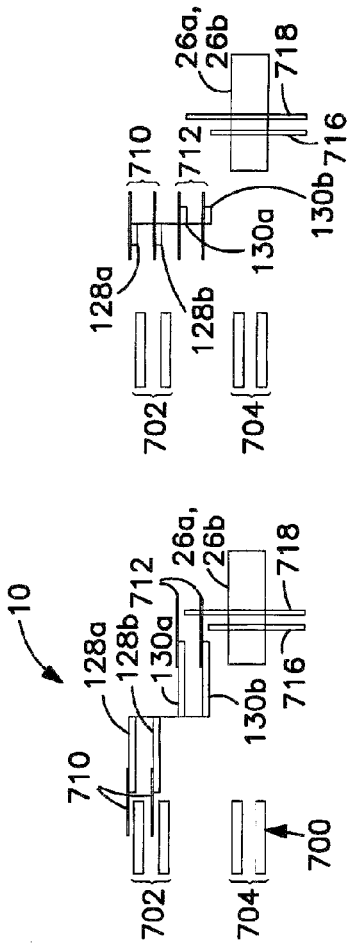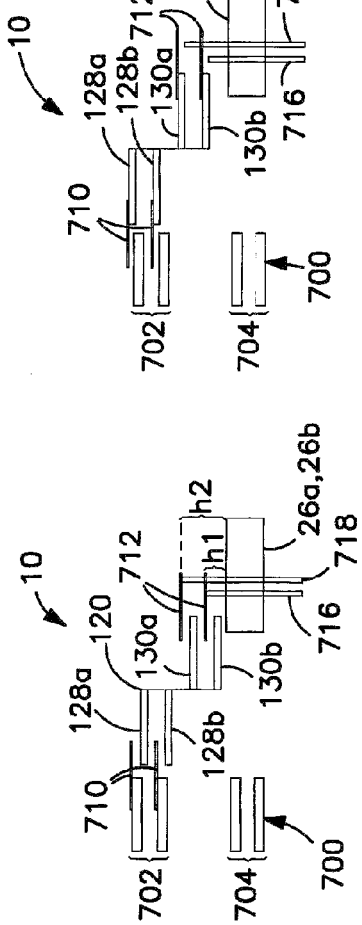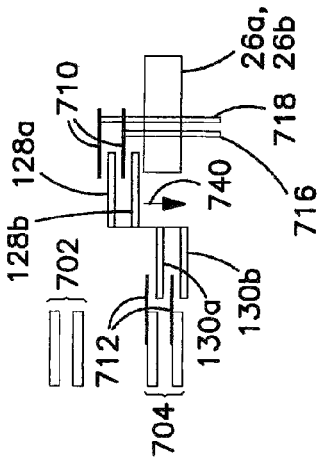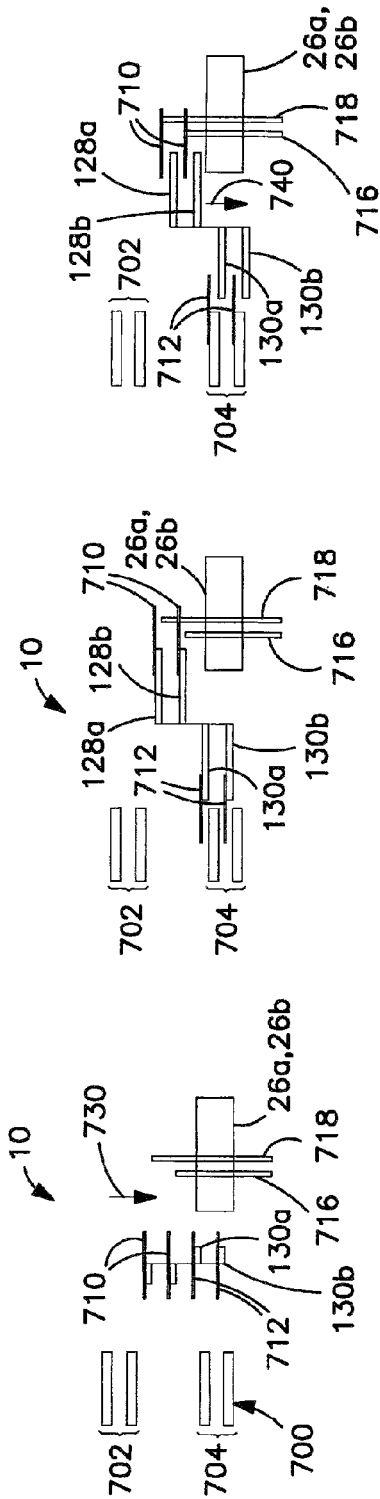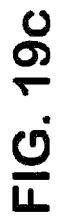

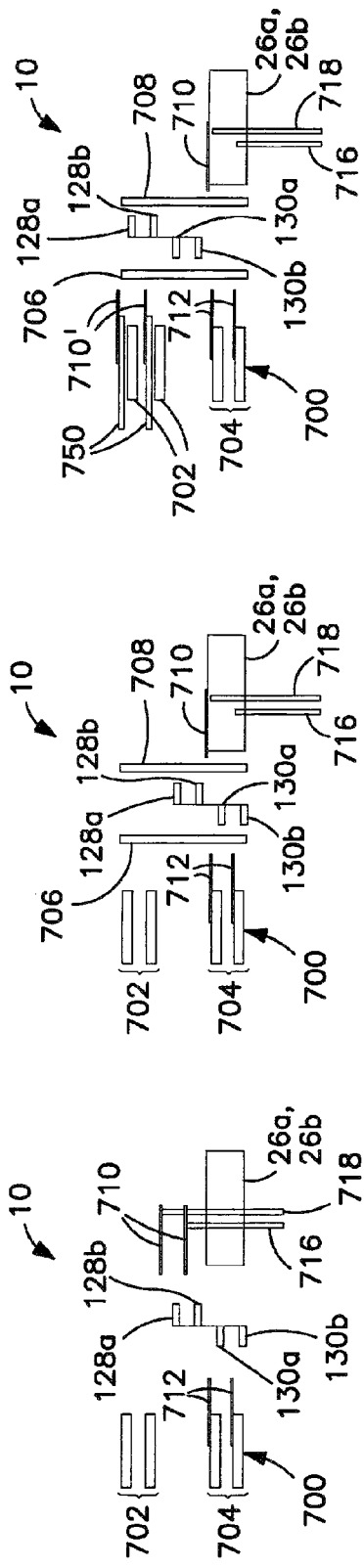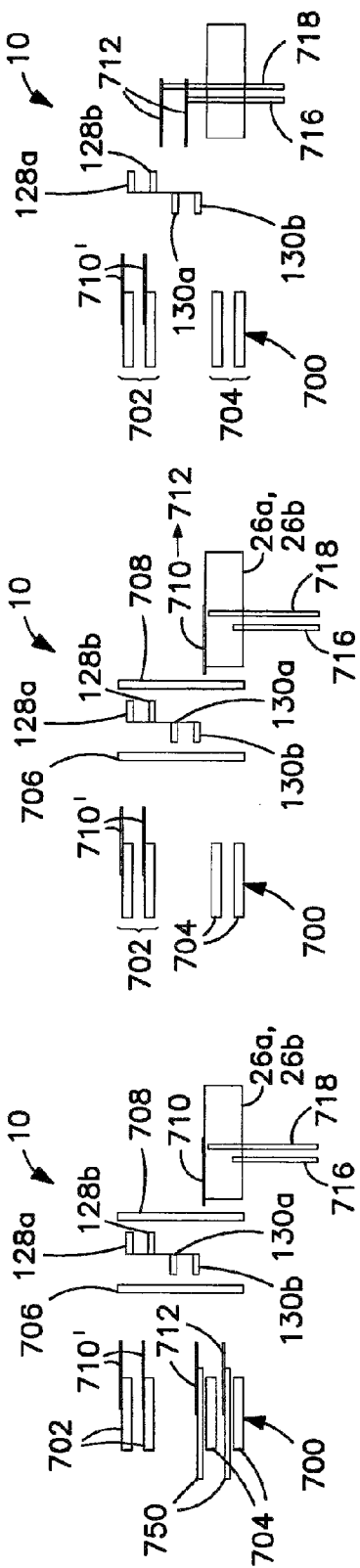

LOW COST HIGH THROUGHPUT PROCESSING PLATFORM

RELATED APPLICATION

This application is a divisional application of copending U.S. patent application Ser. No. 10/919,582 filed on Aug. 17, 2004, the disclosure of which is incorporated herein by reference.

BACKGROUND OF THE INVENTION

Processing systems which expose workpieces such as, semiconductor wafers or other suitable substrates, to an overall treatment regimen for forming a particular device generally employ a plurality of treatment steps. In order to sequentially carry out these steps, each workpiece is typically moved a number of different times, for example, into the system, between various processing stations and out of the system. With the foregoing in mind, it is noted that the prior art contains a number of alternative approaches for use in performing such workpiece transfers and related functions, certain ones of which are interest here, as will be described in further detail immediately hereinafter.

One prior art workpiece transfer approach is demonstrated in U.S. Pat. No. 6,429,139 (hereinafter the '139 patent). More specifically, the '139 patent, in FIGS. 5, 6 and 7A-D, illustrates the use of an articulated robot arm for use in workpiece transfer. While the use of a single wafer paddle is illustrated, it should be appreciated that multiple paddles have been provided using such an articulated robot arm. It should also be appreciated that this particular robot is somewhat simplified to the extent that the prior art provides such a configuration in which vertical movement of the workpiece is also accomplished by the robot. While such articulated robotic arm configurations effectively provide essentially unlimited capabilities with respect to moving workpieces, unfortunately, they are relatively complex and, therefore, expensive to manufacture and maintain.

A simple swing arm, as taught by the prior art, generally comprises an arm member which extends from a pivot point to a wafer paddle. Such a swing arm, therefore, provides for rotational motion of a workpiece. While a swing arm configuration represents a dramatic simplification over the use of an articulated robotic arm, at least generally thought to be accompanied by improved reliability and lower cost, it also represents far more limited capabilities with respect to wafer positioning. Specifically, the swing arm, in its basic configuration, is capable only of moving one wafer along a single diameter, planar circular path. One early swing arm approach is seen in U.S. Pat. No. 4,927,484 (hereinafter the '484 patent). FIGS. 1 and 2 of this patent demonstrate a typical prior art approach in which a plurality of simple swing arms cooperate in order to provide greater workpiece movement flexibility. Again, however, these swing arms appear to be limited to rotation of a workpiece in a single plane.

As an alternative approach to the articulated robotic arm and an improvement over the simple swing arm, the '139 patent also teaches the use of a double-ended swing arm arrangement. Swing arm capability is enhanced through providing an elongated swing arm member having a wafer paddle positioned at each of its opposing ends, with a pivot point centered therebetween, as can be seen in FIG. 8A of the '139 patent. Further, the '139 patent, as seen in FIGS. 9A-D, describes wafer paddles that are rotatable at the ends of the swing arm member so as to at least somewhat improve the positioning capabilities and flexibility of the swing arm over earlier prior art configurations. Unfortunately, however, swing arm positioning capabilities remain limited, despite these improvements, particularly with respect to the capability to move the wafer only in one plane of rotation.

A more recent approach with respect to the use of a swing arm is seen in U.S. Pat. No. 6,610,150 issued to Savage et al (hereinafter Savage). Savage illustrates, in FIG. 8 of the patent, a swing arm having an end effector that is configured for supporting a pair of workpieces. Like the remaining prior art, only simple rotational motion is described wherein typical prior art expedients such as lift pins are used to remove a workpiece from the end effector.

Another area of concern with respect to prior art workpiece processing systems resides in the door arrangements that are used to seal various portions of the system from one another. Many systems utilize, for example, a loadlock chamber (i.e., a chamber that facilitates both workpiece load and unload functions), a transfer chamber and one or more process chambers. Workpieces are typically transferred between the loadlock chamber and the process chamber through the transfer chamber. It is necessary, in such a configuration, to selectively seal the loadlock chamber from the transfer chamber. For purposes of workpiece transfer, a slot or slit is generally defined between the two chambers. Sealing is often performed using a slit door arrangement in which a platelike door member is used to seal the elongated slit. Concerns with respect to prior art slit door arrangements include contamination production, the need for precision alignment and sealing mechanisms.

One prior art slit door configuration is described in U.S. Pat. No. 6,095,741 (hereinafter the '241 patent) having a blade member which is hinged to its actuation arm for pivotal movement about a horizontal axis. This arrangement is considered to be unacceptable, particularly with respect to precision alignment of the elongated, horizontal dimension of the sealing blade and the potential production of contaminants in the absence of such precision alignment, as will be appreciated in view of the descriptions which follow.

With respect to sealing mechanisms, the '241 patent uses a bellows as part of its slit door arrangement, illustrated as item number 704 in FIG. 6A of the patent. While such a bellows mechanism may be effective for purposes of the '241 patent, it is considered as problematic for reasons which include cost and reliability concerns. As will be further described, the prior art has adopted other approaches as alternatives to the bellows mechanism.

One such alternative to the bellows mechanism is illustrated in FIG. 29, which is a partially cutaway view of a prior art slit door configuration that is generally indicated by the reference number 1700. This prior art configuration includes a pivot shaft 1702 that is connected at an upper end to a sealing blade (not shown) for pivotal motion, as indicated by a double headed arrow 1704 about a pivot axis 1706. Pivot shaft 1702 is received in a housing 1710. Sealing between housing 1710 and pivot shaft 1702 is accomplished using a seal flange 1712 that is received on housing 1710 and sealed thereagainst using an O-ring 1714. A seal hat 1716 is supported on pivot shaft 1702 and sealed thereagainst using an O-ring 1718. Seal hat 1716 supports an O-ring 1720 for sealing against a sealing surface 1722 that is defined by seal flange 1712 such that side-to-side motion of O-ring 1720 against sealing surface 1722 is accommodated. Unfortunately, however, pivotal motion of pivot shaft 1702 also imparts tilting of seal hat 1716 thereby compressing one portion of the O-ring 1720 while releasing an opposing portion of the O-ring. This behavior is disadvantageously considered to limit the range of pivotal motion of pivot shaft 1702.

The present invention resolves the foregoing limitations and concerns while providing still further advantages.

SUMMARY OF THE INVENTION

A system for processing workpieces, as well as an associated apparatus and method are described. A plurality of workpieces are movable to and from a process chamber arrangement in the system. The process chamber arrangement uses at least two side-by-side, first and second process stations each of which is configured for executing a treatment process on one of the workpieces located at each of the first and second process stations such that two workpieces can simultaneously be exposed to the treatment process. In one aspect of the present invention, a workpiece support arrangement, separate from the process chamber arrangement, is used for supporting at least two of the workpieces at least generally in a stacked relationship to form a workpiece column. A workpiece transfer arrangement, also separate from the process chamber arrangement, is used for transporting at least two of the workpieces between the workpiece column and the process chamber arrangement by simultaneously moving the two workpieces at least generally along first and second transfer paths, respectively, that are defined between the workpiece column and the first and second process stations.

In another aspect of the present invention, workpieces are movable to and from a process chamber arrangement, the process chamber arrangement using at least two side-by-side process stations, each of which is configured for treating individual ones of the workpieces located at each of the process stations such that at least two workpieces can simultaneously be treated. A workpiece support arrangement, separate from the process chamber arrangement, supports at least two of the workpieces at least generally in a stacked relationship to form a workpiece column. A workpiece transfer arrangement, separate from the process chamber arrangement, is configured at least for simultaneously moving two pre-treatment ones of the workpieces from the workpiece column to each of the side-by-side process stations.

In still another aspect of the present invention, workpieces are movable to and from a process chamber arrangement that is configured for executing a treatment process on at least one of the workpieces. A workpiece support arrangement, separate from the process chamber arrangement, supports at least one of the workpieces for movement in relation to the process chamber arrangement. A swing arm arrangement, separate from the process chamber arrangement, includes at least a first swing arm for providing pivotal rotation of at least one workpiece about an axis of rotation, as part of transporting the workpiece between the workpiece support arrangement and the process chamber arrangement, and for moving in a direction that is at least generally along the axis of rotation, as another part of transporting the workpiece, to change an elevation of the swing arm such that the workpiece being transported can be moved between different spaced-apart elevational planes in addition to the pivotal rotation.

In yet another aspect of the present invention, workpieces are movable to and from a process chamber arrangement that is configured for executing a treatment process on at least one of the workpieces. A swing arm arrangement includes at least a first swing arm for providing pivotal rotation of at least one workpiece about an axis of rotation, as part of transporting the workpiece at least in relation to the process chamber arrangement, and for moving in a direction that is at least generally along the axis of rotation, as another part of transporting the workpiece, to change an elevation of the swing arm such that the workpiece being transported can be moved between different spaced-apart elevational planes in addition to the pivotal rotation.

In a continuing aspect of the present invention, workpieces are movable to and from a process chamber arrangement in a system, the process chamber arrangement using at least one process station that is configured for executing a treatment process on at least one of the workpieces. A workpiece support arrangement is arranged in one spaced apart relationship from the process chamber arrangement for supporting at least one of the workpieces. A swing arm arrangement is positioned in another spaced apart relationship from the process chamber arrangement including at least a first swing arm and a second swing arm configured for coaxial rotation about a common axis of rotation for use in transporting the workpieces between the workpiece support arrangement and the process chamber arrangement.

In a further aspect of the present invention, workpieces are movable to and from a process chamber arrangement in a system. The process chamber arrangement uses at least one process station that is configured for executing a treatment process on at least one of the workpieces. A swing arm arrangement, forming part of the system, includes at least a first swing arm and a second swing arm configured for coaxial rotation about a common axis of rotation for use in transporting the workpieces in relation to the process chamber arrangement.

In another aspect of the present invention for processing workpieces using a treatment process, a system configuration includes a pair of side-by-side first and second process stations, each process station configured for applying the treatment process to one of the workpieces. A workpiece support arrangement is configured for supporting one or more of the workpieces. The workpiece support arrangement being positioned at a first distance at least approximately equally from each of the process stations. First and second swing arm arrangements are arranged to pivot about a first axis and a second axis, respectively, such that each one of the first axis and the second axis is positioned at least approximately at a second distance from the workpiece support arrangement while the first axis is at least approximately spaced away from the first process station by the second distance and the second axis is at least approximately spaced away from the second process station by the second distance, such that the first process station, the second process station, the first axis, the second axis and the wafer column cooperate to define a pentagonal shape.

In still another aspect of the present invention, a workpiece processing system, for processing workpieces using a treatment process, includes a configuration having a pair of side-by-side first and second process stations defining a line extending through a first center of the first process station and a second center of the second process station, each process station is configured for applying the treatment process to at least one of the workpieces. A workpiece support arrangement is configured for supporting at least one of the workpieces laterally offset from the line. First and second swing arm arrangements, each of which pivots about a first axis and a second axis, respectively, are arranged at a first swing arm location and a second swing arm location, and each of the first swing arm location and the second swing arm location is offset from the line on a common side thereof toward, but not beyond the workpiece support arrangement such that the first process station, the second process station, the first axis, the second axis and the wafer column cooperate to define a pentagonal shape.

In a continuing aspect of the present invention, in using a first, driven shaft to rotationally drive a second shaft, a configuration includes first and second toothed flexible closed-loop members. A first pulley arrangement is mounted on the first shaft and a second pulley arrangement is mounted on the second shaft for receiving the first and second toothed flexible members in a side-by-side relationship such that at least a particular one of the pulley arrangements includes a first pulley engaging the first toothed flexible member and a second pulley engaging the second toothed flexible member, each of the first and second pulleys having a tooth receiving configuration which cooperates with the first and second toothed flexible members to provide a given backlash clearance when engaged with the first and second toothed belt members, respectively. The first pulley and the second pulley are mounted with a rotational offset therebetween such that the tooth receiving configuration of the first pulley is rotationally offset with respect to the tooth receiving configuration of the second pulley, based on the given backlash clearance, in a way which limits an operational backlash of the particular pulley arrangement with respect to movement of the first and the second toothed flexible members to a value that is less than the given backlash clearance.

In still another aspect of the present invention, a valve apparatus and method are described for use in a workpiece processing system for processing workpieces. The system includes at least two adjacent chambers with a slot defined therebetween, through which slot the workpieces are transportable and a chamber sealing surface, that is at least generally planar, surrounding the slot and supporting a sealing arrangement surrounding the slot. The valve apparatus being configured for selectively opening and closing the slot using a sealing blade member including a blade surface that is configured for sealingly engaging the sealing arrangement. An actuator arrangement moves the sealing blade member between an open position, away from the slot, to provide for passage of the workpieces therethrough, and a closed position in which the sealing blade member is brought into sealing contact at least with the sealing arrangement and for supporting the sealing blade member in a way which provides for movement of the blade surface, at least responsive to engagement with the sealing arrangement, that is characterized by two degrees of freedom for aligning the blade surface with the sealing arrangement and, thereby, the sealing surface.

In a still further aspect of the present invention, a configuration is described for use in a workpiece processing system for processing workpieces. The system having at least two adjacent chambers that are subject to contamination from internally and externally produced contaminants. The configuration includes a chamber body arrangement which serves to define the adjacent chambers and a slot between the adjacent chambers, through which slot the workpieces are transportable and a chamber sealing surface, that is at least generally planar, surrounding the slot. The chamber body arrangement further defining a chamber trough adjacent the slot and therebelow to form a portion of a particular one of the adjacent chambers such that the chamber trough establishes a lowermost region of the chamber body arrangement serving as a collection region for the contaminants, at least in being under an influence of the Earth's gravity, and the chamber body arrangement further defines a pumping port at least for use in evacuation of the particular chamber. A valve arrangement is supported in the particular chamber for selective movement between a closed position, in which a sealing blade thereof seals against the slot to isolate the adjacent chambers from one another, and an open position, in which the sealing blade retracts into the trough. A pumping arrangement is connected to the pumping port at least for use in evacuation of the particular chamber by pumping from the trough in a way which serves to remove at least a portion of the contaminants collected in the trough.

BRIEF DESCRIPTION OF THE DRAWINGS

The present invention may be understood by reference to the following detailed description taken in conjunction with the drawings briefly described below.

FIG. 5b is a diagrammatic partially cut-away view, in cross-section, illustrating details of an end effector height adjustment arrangement, shown here to illustrate features that are not visible in the view of FIG. 5a.

FIGS. 8 and 9 are diagrammatic plan views of cams that are used in the swing arm assembly of FIG. 5a-7, for use in establishing the height of each swing arm.

FIG. 11 is a diagrammatic view, in perspective, illustrating further details with respect to one swing arm arrangement of the dual swing arm arrangement of FIG. 5a.

FIGS. 19a-19l form a series of diagrammatic elevational views which cooperate with the plan views of FIGS. 18a-18e to illustrate further details of the process.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Further, like reference numbers are applied to like components, whenever practical, throughout the present disclosure. Descriptive terminology such as, for example, uppermost/lowermost, right/left, front/rear and the like has been adopted for purposes of enhancing the reader's understanding, with respect to the various views provided in the figures, and is in no way intended as been limiting.

Figure 1A:
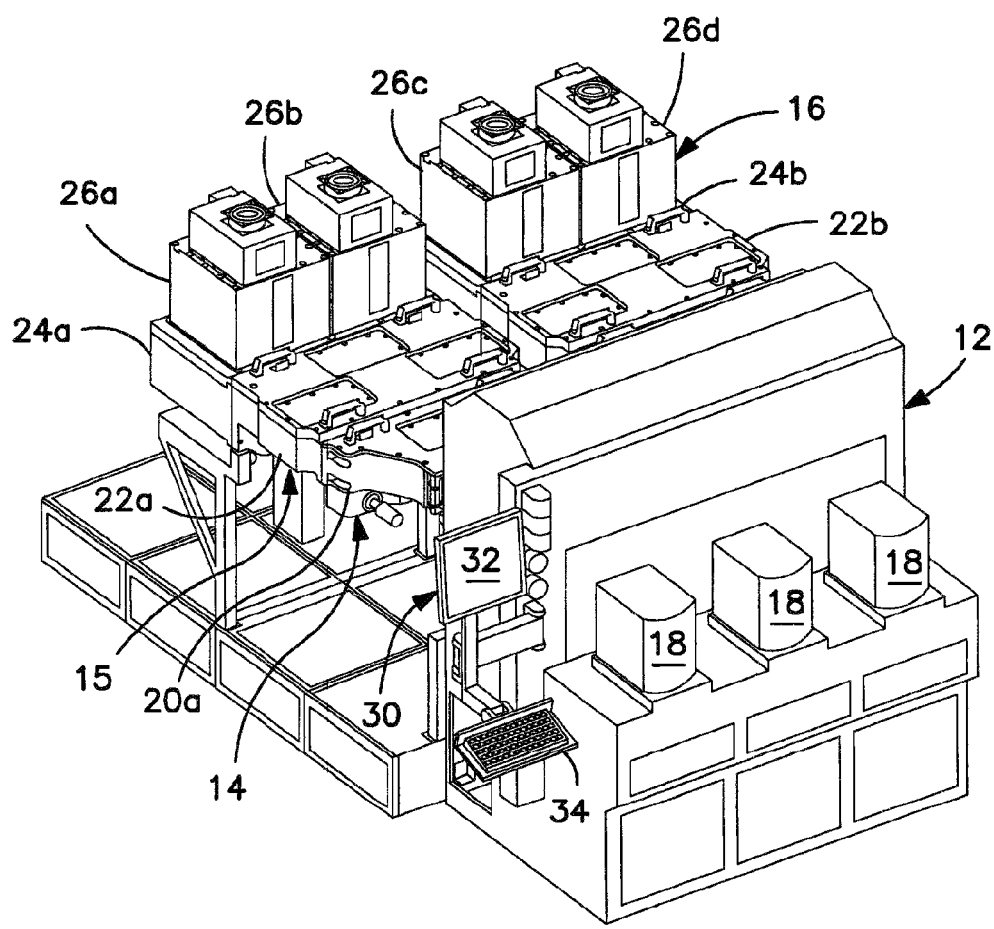
FIG. 1a is a diagrammatic view, in perspective, of a workpiece processing system that is produced in accordance with the present invention.
Figure 1B:
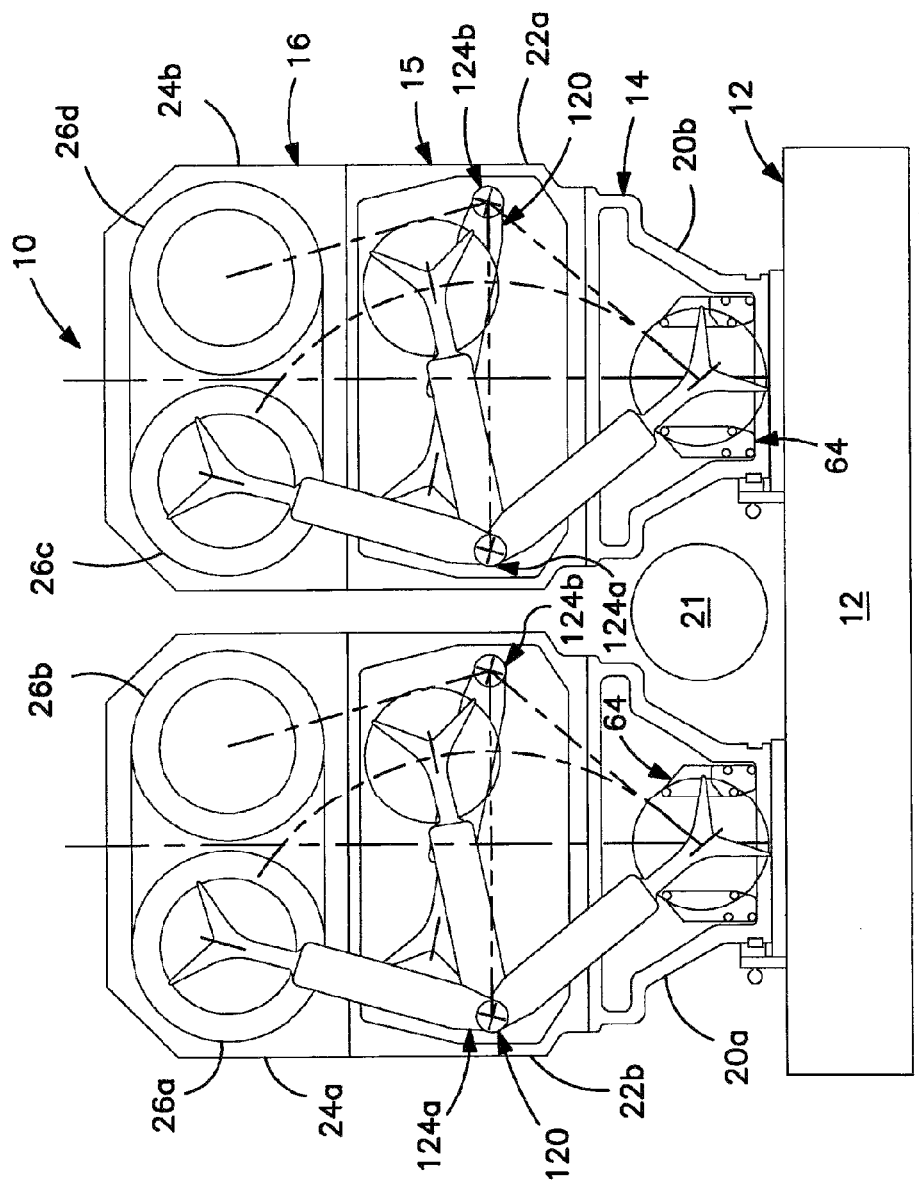
FIG. 1b is a diagrammatic plan view of the system of FIG. 1a, shown here to illustrate further details of its structure.

Referring to FIGS. 1a and 1b, the former is a diagrammatic view, in elevation, of a processing system, generally indicated by the reference number 10, according to one embodiment of the present invention. FIG. 1b is a diagrammatic plan view of system 10. The processing system is generally made up of a front end 12, a loadlock section 14, a wafer handling section 15 and a processing section 16. This system can be employed to perform a wide variety of processes on suitable workpieces such as, for example, various implementations of etching (plasma etching, photo-chemical etching, chemical vapor etching, thermally driven etching, ion etching, etc.), planarization (combination of etching and deposition), cleaning and residue removal, and various implementations of chemical, physical and ion deposition (PECVD, ALD, MOCVD, sputtering, evaporation, etc.). Suitable workpiece types include, but are not limited to semiconductor, opto-electronic, memory media, and flat panel displays. Suitable workpiece materials include, but are not limited to silicon, silicon germanium, glass and plastic. Suitable plasma based process sources include, for example, inductively coupled plasma (ICP) sources, microwave sources, surface wave plasma sources, ECR plasma sources, and capacitively coupled (parallel plate) plasma sources. Any appropriate process-defined pressure may be utilized.

Still referring to FIGS. 1a and 1b, front end 12 is generally at atmospheric pressure and defines a "mini-environment" that is configured for engaging a plurality of cassettes or FOUPs (Front Opening Unified Pods shown in FIG. 1a) 18 or other suitable workpiece transfer postions each of which, in the present example, is configured for supporting 25 semiconductor wafers. Opposite the engagement surfaces for the FOUPs, front end 12 is configured for engaging a pair of first and second loadlocks 20a and 20b (only first loadlock 20a is visible in the view of FIG. 1a), collectively or individually referred to as loadlock(s) 20. FIG. 1b illustrates, an intermediate station 21, which may comprise, for example, a cooling station, that is positioned between loadlocks 20a and 20b. The first and second loadlocks are generally identical to one another and engage first and second transfer chambers, individually indicated by the reference numbers 22a and 22b, and collectively or individually referred to as transfer chamber(s) 22. The transfer chambers, in turn, engage first and second process chambers 24a and 24b, and may be referred to collectively or individually referred to as process chamber(s) 24. Each process chamber, as will be seen below, employs a side-by-side workpiece arrangement or side-by-side process stations in which each process chamber can simultaneously expose a pair of workpieces to the same process. It is to be understood that process chambers 24a and 24b may be used to practice the same process or to practice different processes.

With continuing reference to FIGS. 1a and 1b, in the present example, four plasma sources 26a-d are used, corresponding to the four process stations, collectively provided by the process chambers for purposes of convenience. Reference numbers 26a-d may be used to refer to associated ones of the process stations. It is noted that one suitable process chamber configuration, that is useful in the context of the present invention, is described in copending U.S. patent application Ser. No. 10/828,614 which is commonly owned with the present application and incorporated herein by reference. Appropriate valves are provided between the various chambers, as will be further described, since processing is usually accomplished by way of a staged vacuum sequence, starting from front end 12. In such a processing regimen, loadlocks 20 can be pumped down to a treatment or intermediate pressure from atmospheric pressure prior to transferring workpieces to and from process chambers 24 through transfer chambers 22. It should be appreciated that system 10 can readily be configured with only one process chamber 24, one transfer chamber 22 and one loadlock 20, for example, in the case where one process chamber can achieve a desired level of throughput or where sequential processing is not required. An operator station 30, including a display 32 and input device 34, is provided connected with a computer 40 for use in controlling the system. It is considered that one having ordinary skill in the art is capable of appropriately programming computer 40 in order to achieve the functionality described herein, in view of this overall disclosure.

It is noted that piping and pumping facilities have not been illustrated in FIG. 1a for purposes of illustrative clarity. A common facilities input can be used for the distribution of pneumatics air, purge gas, process gas(es), and cooling water to one or two module configurations. Similarly, a single vacuum pump can be incorporated for single or dual module loadlock pumping accommodations. Separate gas panels can be used to deliver process gasses to each module and each process module has been configured with its own vacuum pump and pressure control devices, allowing for parallel processing capabilities. Pressure transducers affixed to the loadlock(s), transfer chamber(s) and process chamber(s) are used to communicate pressures associated with processing functionality. Additionally, an assortment of vacuum and pressure switches affixed to vacuum roughing lines are used for interlock purposes. In view of this overall disclosure, it is considered that one having ordinary skill in the art is capable of implementing such facilities.

Figure 2:
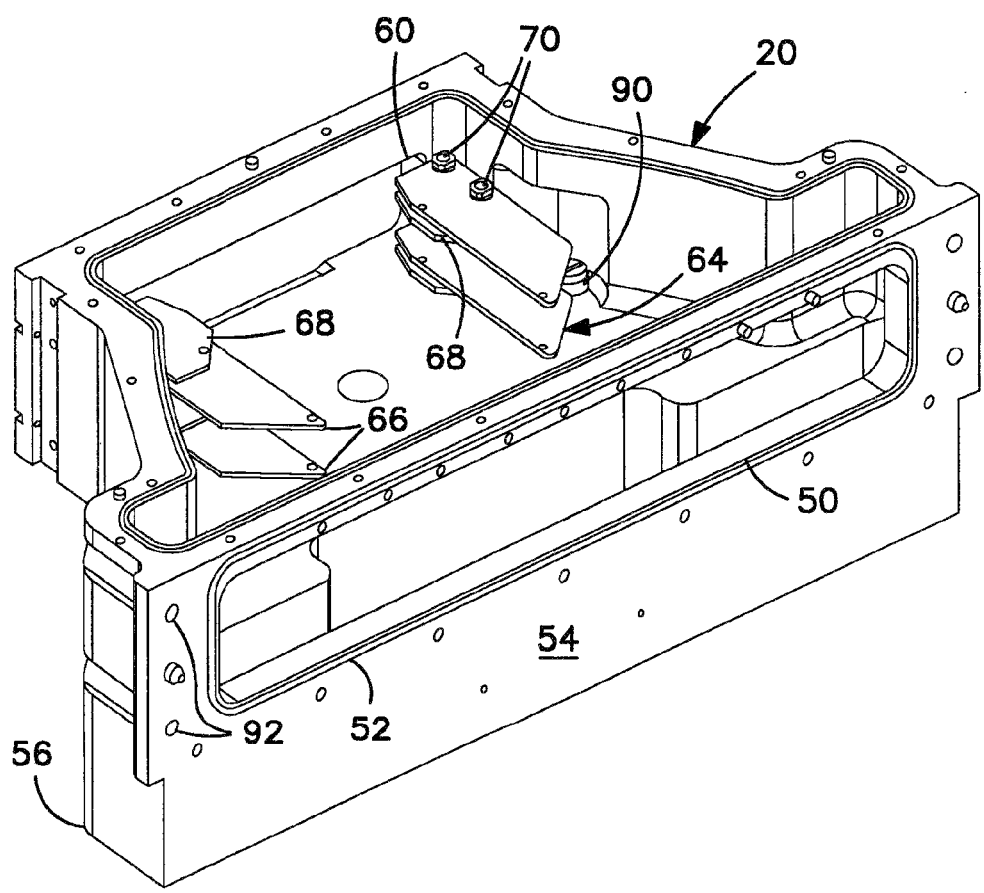
FIG. 2 is a diagrammatic perspective view of a loadlock used in the system of FIG. 1a, shown here to illustrate details of its structure.

Attention is now directed to FIG. 2 which shows one of loadlocks 20 in isolation from the remainder of the system. It is noted that the top plate of the loadlock has not been shown to facilitate a view of interior details of its structure. Loadlock 20 includes an overall body which defines a slit aperture 50 for communicating with one of transfer chambers 22. An o-ring 52 is received in a face or chamber sealing surface 54 of the loadlock for sealing against the associated transfer chamber. A trough 56 is formed by the loadlock chamber body for receiving a valve arrangement (not shown) having a blade member that is used to seal against the surface of the wall which opposes face 54, as will be further described in detail below. For the moment, it is appropriate to note that the blade member advantageously retracts into trough 56 when the valve arrangement is in an open position. On an opposing portion of the transfer chamber body, essentially opposite slit aperture 50, a front end slit 60 is defined through which workpieces are transferred to and from front end 12 of FIG. 1a. Any appropriate slit door arrangement may be used for purposes of sealing front end slit aperture 60 including, for example, the arrangement that is used on slit aperture 50, yet to be described. Other suitable door arrangements including a magnetic door and a pneumatic door are described in U.S. Pat. No. 6,315,512, which is commonly owned with the present application, and incorporated herein by reference.

Still referring to FIG. 2, a shelf arrangement 64 is provided for supporting workpieces in loadlock 20 as these workpieces are transferred to and from both the front end and the process chamber of FIGS. 1a and 1b. The shelf arrangement is made up of two sets of spaced apart blade members alternating between a long blade 66 and a short blade 68 in an overall stacked relationship. Accordingly, each set of blade members includes two long blades 66 and two short blades 68. It should be noted that one long blade in combination with one short blade serves to make up a shelf for an individual workpiece such that each shelf includes an asymmetric configuration. The long and short shelf blades may be formed using any suitable material such as, for example, aluminum. Further details will be provided below with respect to the use of this asymmetric configuration. Each shelf arrangement is supported using a pair of fasteners 70 which may be of any suitable type such as, for example, stainless steel. Spacers may be used to achieve the appropriate spaced apart relationship between the shelf blade member. The spacers may be formed, for example, using the same material from which the shelf blades are formed. The shelf arrangement is configured for supporting four workpieces in four vertically spaced apart support stations. As will be described in further detail below, the two uppermost workpiece support shelves are dedicated for use in supporting a pair of preprocess ones of the workpieces while the two lowermost workpiece support shelves are dedicated for use in supporting a pair of postprocess ones of the workpieces. Thus, preprocess workpieces are always moved from front end 12 of FIG. 1a to the preprocess workpiece support shelves and then on to an associated one of process stations 26. Conversely, the lower pair of workpiece support stations is dedicated to the postprocess workpieces such that processed workpieces are always moved from an associated one of process stations 26 to the postprocess pair of shelves. Workpieces are stacked in the shelves so as to form a workpiece column, as will be further described below. It is appropriate to note, for the moment, that pairs of workpieces can be moved simultaneously to and from this workpiece column.

Figure 3:
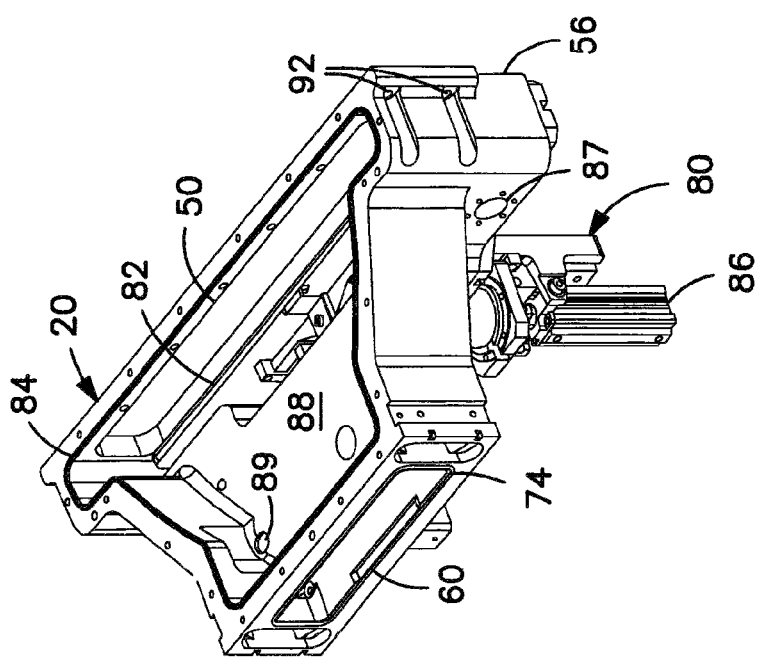
FIG. 3 is another diagrammatic perspective view of the loadlock of FIG. 2 further illustrating the appearance of a slot door arrangement, as well as further details of the structure of the loadlock.

Referring now to FIG. 3 in conjunction with FIG. 2, the former illustrates loadlock 20, in a perspective view, to illustrate further details of its construction, having shelf arrangement 64 removed. It is again noted that the top plate of the loadlock has not been shown to facilitate a view of interior details of its structure. Specifically, front end slit aperture 60 is shown surrounded by an O-ring seal 74. Further, a slit door valve arrangement 80 is shown installed for sealing slit aperture 50. The slit valve arrangement includes a sealing blade 82 which is illustrated retracted into trough 56 of the loadlock body. Loadlock 20 is illustrated, like other chambers in the various figures, having its cover or lid removed for purposes of illustrative clarity. FIG. 1a, however, shows these covers as they appear installed. A suitable seal such as, for example, an O-ring seal 84 may be used to seal the lid against the chamber body. Slit valve arrangement 80 is actuated, in the present example, using a pneumatic linear actuator 86. Loadlock 20 defines a pair of pumping ports, only one of which is visible, indicated by the reference number 87. It is of interest to note that these pumping ports are arranged to pump from trough 56. This arrangement is considered to be advantageous since this trough comprises a low point within the overall loadlock. Accordingly, the trough serves as a collection area for particles and other contamination that is introduced into the loadlock during normal operation of the system. By pumping from the trough, as a low point, it is intended to remove particles and contamination as a normal consequence of operating the system. Loadlock 20 also includes a floor 88, above trough 50, which defines a pair of purge ports, only one of which is visible in the floor, indicated by the reference number 89. Purge ports 89 can be used in cooperation with pumping ports 87 to provide a crossflow during pumping of the loadlock. That is, appropriate gases can be introduced through purge ports 89 while pumping takes place from pump ports 87. In this way, contaminants can advantageously be caused to flow toward and into trough 56 for removal therefrom by pumping, as will be further described. In FIG. 2, it is noted that the illustrated purge port receives a diffuser 90, which can be formed, for example, from sintered metal, or porous ceramic or composite material (such as stainless steel, aluminum oxide, impregnated carbon fibers, among others).

Figure 4:
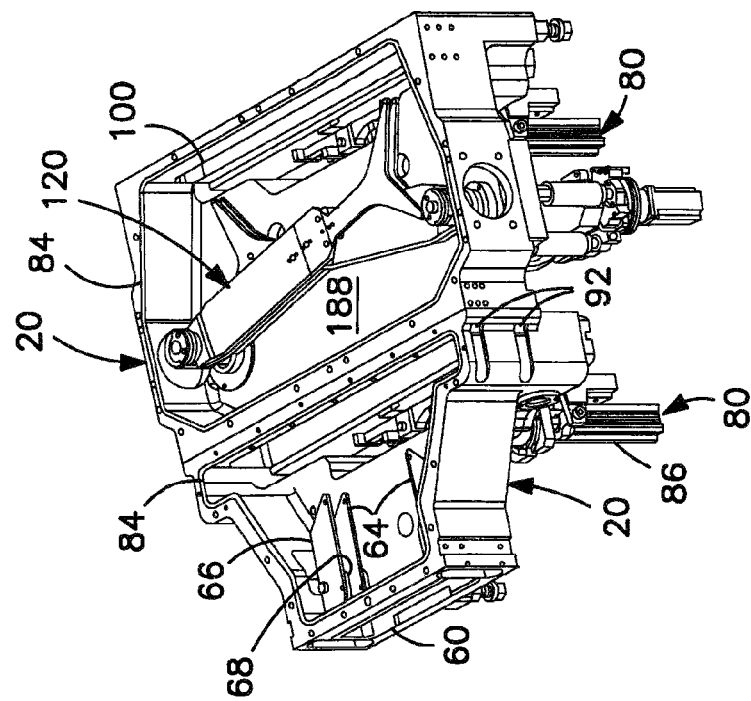
FIG. 4 is a diagrammatic view, in perspective, showing a transfer chamber that is used in the system of FIG. 1a connected to the loadlock also used in the system and shown in further detail in FIGS. 2 and 3.

Attention is now directed to FIG. 4, which illustrates loadlock 20 connected to transfer chamber 22. It is also noted that various features that are the subject of the present discussion can be seen in prior figures such as, for example, FIGS. 1*a* and 1*b*. Further, the top plate of both the loadlock and the transfer chamber have not been shown to facilitate a view of interior details of their features. The two chambers can be affixed to one another in any suitable manner such as, for example, using threaded fasteners that are inserted through mounting holes 92, shown in FIGS. 2-4. Transfer chamber 22 defines a process chamber slit door 100 configured for interfacing with one of process chambers 24, shown in FIGS. 1*a* and 1*b*. In the present example, slit door valve arrangement 80 is also used for purposes of opening and closing process chamber slit door 100. Process chamber 22 is configured for supporting a swing arm arrangement 120 that is made up of four individual swing arms arranged in counterrotating pairs, as will be described immediately hereinafter.

Figure 5A:
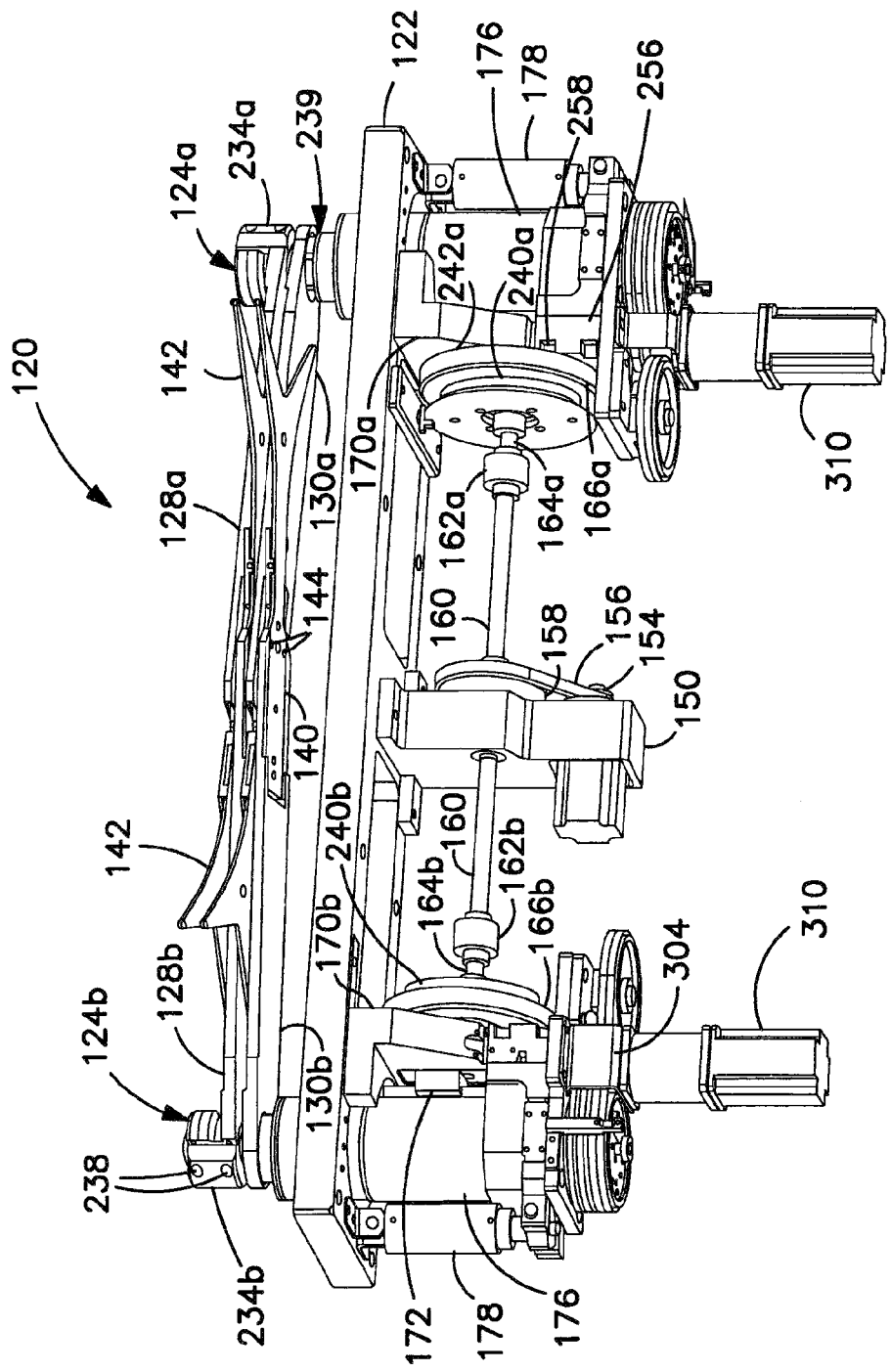
FIG. 5a is a diagrammatic perspective, isolated view illustrating details of a dual swing arm arrangement that is used in the transfer chamber of FIG. 4.

Turning now to FIG. 5*a* in conjunction with FIG. 4, the former figure illustrates swing arm arrangement 120 in a perspective view and removed from transfer chamber 22 for purposes of illustrative clarity. It is noted that FIG. 1*b* diagrammatically illustrates swing arm arrangement 120 with respect to counterrotation, however, its full symmetric movement capabilities are seen in figures yet to be described. An overall baseplate 122 supports first and second swing arm pairs 124*a* and 124*b*, respectively. It is noted that identical reference numbers will be used to refer to the first and second swing arm pairs, having components associated with a particular pair identified by using "a" or "b" appended to the appropriate reference number. Thus, components that are identical in each of the swing arm pairs may be referred to individually or collectively without the appended "a" or "b". For example, the swing arm pairs collectively include upper blades 128*a* and 128*b*, which may be referred to collectively or individually, for purposes of convenience, as upper blade(s) 128. The swing arm pairs further include lower swing arm blade(s) 130. Each of the upper swing arm blades extends to a distal end 140 that is configured for attachment of an end effector 142 that is best seen as attached to swing arm blade 130*b*, in FIG. 5*a*. Another end effector is similarly attached to swing arm blade 130*a*. A group of threaded fasteners 144 is used to adjustably attach end effector 142 to each swing arm blade. In this way, alignment adjustments are provided such that the end effectors appropriately interlace with the shelves of shelf arrangement 64 of FIGS. 2 and 4, as well as being properly interlaced with one another in a non-interfering manner, even when loaded with workpieces. It is noted that the swing arms are shown in a convenient "home" position above baseplate 122, as will be further described. Further, a reference to a swing arm(s) can refer to the combination of one or more swing arm blades with an associated end effector. Thus, swing arm 130*b* refers to swing arm blade 130*a* in combination with an attached one of end effectors 142.

Referring to FIG. 5*b* in conjunction with FIG. 5*a*, the former is a cross-sectional view of the adjustable manner in which end effector 142 is attached to distal end 140 of each swing arm blade such as, for example, swing arm blade 130*b*. In particular, fastener group 144 includes a pair of locking flat head fasteners 146*a* and 146*b*, although any appropriate fastener can be used. A dowel pin 147 is press-fitted into an aperture that is defined by swing arm blade 130*b*, having a free end that projects through another aperture that is defined by end effector 142. A helical coil spring 148 surrounds dowel pin 147 and resiliently, locally biases the end effector away from the swing arm blade. A hex screw 149, or other suited threaded device, is threadingly received by swing arm blade 130*b* for use in adjusting the end effector height in combination with fasteners 146*a* and 146*b*. It is noted that the surface of swing arm blade 130*b* confronting end effector 142 and surrounding fastener 146*b* is arcuate in configuration to accommodate changes in the angle of end effector 142 relative thereto with height adjustment. End effector height adjustment may be accomplished, in one exemplary way, by initially tightening fastener 146*b* "snuggly" and fastener 146*a* at least slightly withdrawn from a seated position. Fastener 146*a* is then adjusted to set end effector 142 at a desired angle. Hex screw 149 is then tightened to lock the desired end effector orientation.

Referring to FIG. 5*a*, a bracket 150 extends downward from baseplate 122 for supporting a lift motor 152 which rotates a lift motor pulley 154 which, in turn, engages a lift belt 156. Lift belt 156 is received around a lift pulley 158 that is supported on a shaft 160 which is itself rotatably supported by bracket 150. It is noted that lift belt 156 may be tensioned in any suitable manner that is available in the prior art. As one example, one or more fasteners used to mount lift motor 152 may be received in slotted holes such that the motor can be pivoted to tension lift belt 156. Having accomplished tensioning, the fasteners are then tightened. Any suitable motor may be used as lift motor 152 such as, for example, a servo or stepper based motor. As will be seen, no more than one full revolution of pulley 158 is needed. It is noted that this motor includes an encoder for reading the position of its output shaft and thereby identifying the position of lift pulley 158 with a suitable degree of precision. Opposing ends of shaft 160 are received in couplers 162 (where coupler 162*a* is associated with first swing arm pair 124*a* and coupler 162*b* is associated with second swing arm pair 124*b*), each of which then engages a cam drive shaft 164 (where cam drive shaft 164*a* is associated with first swing arm pair 124*a* and cam drive shaft 164*b* is associated with second swing arm pair 124*b*). Cams 166*a* and 166*b* will be described in further detail below. For the moment, it is appropriate to note that these cams facilitate customized vertical motion of each swing arm pair, responsive to rotation of lift motor 152. The arrangement described herein is advantageous with respect to providing synchronous vertical motion at spaced apart swing arm configuration locations, using a single drive motor. In the alternative, however, separate drive motors can be used to produce vertical motion of each swing arm pair. In this case, each motor may include an encoder, or a separate encoder may be provided for use in reading the vertical position of each swing arm pair.

Figure 6:
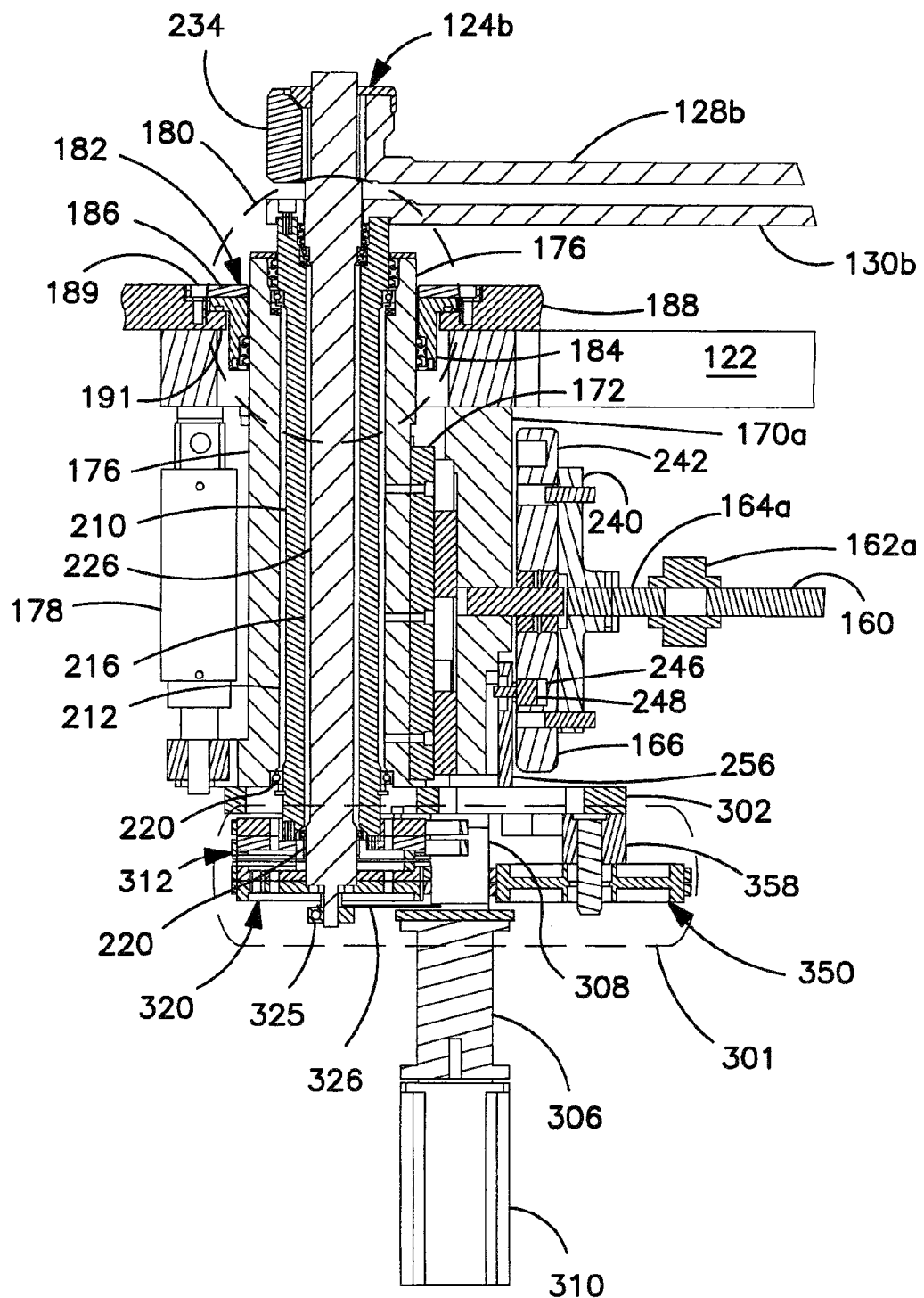
FIG. 6 is a diagrammatic enlarged cut-away view, in cross-section, of the swing arm arrangement of FIG. 5a, shown here to illustrate further details of its structure.

Referring to FIG. 6 in conjunction with FIG. 5*a*, attention is now directed to details of the swing arm mechanisms. To that end, FIG. 6 is a partial, further enlarged cross-sectional view, in elevation, of swing arm pair 124*b*. It is to be understood, that swing arm pair 124*a* is essentially identically configured, with certain exceptions to be noted. The first and second swing arm pairs are supported using brackets 170*a* and 170*b* that are suitably attached to base plate 122 so as to extend downwardly therefrom. A linear stage 172 is used to engage a swing arm housing 176 so as to provide for up/down linear motion of the swing arm housing relative to brackets 170. One suitable linear stage 172 is available from NSK Japan, although any number of alternative configurations can be provided which accomplish the desired linear motion. Pneumatic cylinders 178 are provided, pivotally engaging and captured between base plate 122 and housing 176 of each swing arm arrangement. Cylinders 178 are provided for counterbalance purposes and can provide downward and upward biasing force for the swing arm arrangements with respect to base plate 122. For example, the cylinders can provide a force that counteracts that of atmospheric pressure, when the transfer chamber is under vacuum. As another example, when the transfer chamber is running at atmospheric pressure, a force can be provided to counter the weight of the robot under the force of gravity. In this regard, pressure regulation is provided to the cylinders in a known way to produce and change the applied biasing force. Moreover, one or more additional cylinders can be provided depending upon load demands or a single cylinder can be used.

Figure 7:
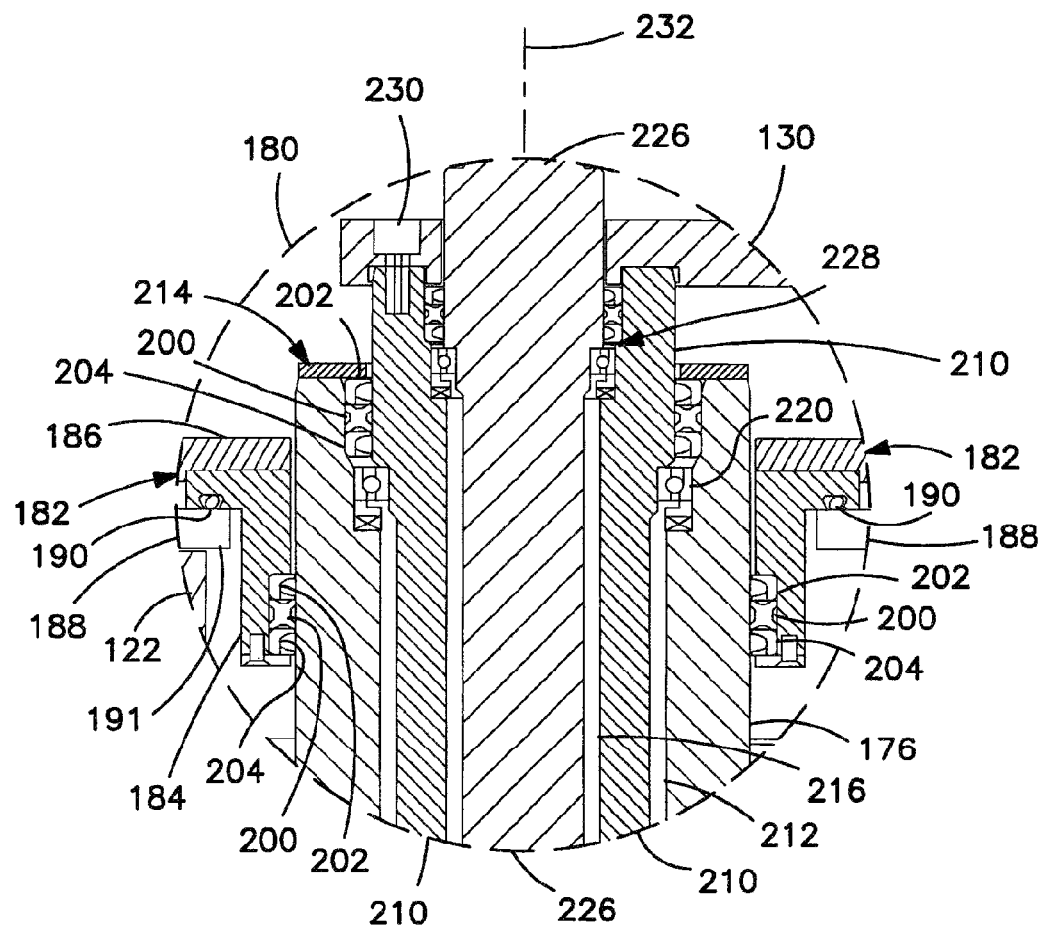
FIG. 7 is a diagrammatic enlarged cut-away view, in cross-section, of the swing arm arrangement of FIG. 6 that is further enlarged to illustrate details with respect to inner and outer swing arm shafts as well as a housing therefor.

Referring to FIGS. 5*a*-7, attention is now directed to further details with respect to the configuration of swing arm arrangement 120. FIG. 7 is a further enlarged view, showing details within a dashed circle 180 which appears in FIG. 6. Housing 176, being supported for vertical motion, is sealed against the transfer chamber bottom using a seal arrangement 182. The latter includes an annular L-bracket 184 (FIG. 7) having one end that is captured between an annular sealing ring 186 and a bottom wall 188 of transfer chamber 20 (see also FIG. 4). Sealing ring 186 can be retained in position, for example, using threaded fasteners 189. An O-ring 190 is captured within an annular O-ring groove so as to seal L-bracket 184 against a peripheral step 191 (FIGS. 6 and 7) that is defined by transfer chamber bottom 188. An opposing end of L-bracket 184 includes an annular seal arrangement that is made up of a quad seal 200 that is held in position using a pair of grease retainers 202 and 204 positioned above and below the quad seal, respectively. This quad seal, like all other such seals described herein, should be lubricated using an appropriate lubricant such as, for example, a fluorinated grease that is carried by grease retainers 202 and 204. Moving inward with respect to housing 176, an outer swing arm shaft 210 supports lowermost swing arm 130 of each swing arm pair. Outer swing arm shaft 210 is supported for rotation, at least in part, within a through passage 212, defined by housing 176, using an upper bearing and seal assembly 214 (FIG. 7). The latter includes another quad seal 200 and grease retainers 202 and 204 that are captured within an annular groove configuration which surrounds an uppermost opening leading into a through passage 216 which is defined by outer swing arm shaft 210. Below the seal arrangement, in the view of FIG. 7, a bearing 220 is received for rotationally supporting the upper end of outer swing arm shaft 210. A similar bearing 220 (FIG. 6) supports a lowermost end of outer swing arm shaft 210. An inner swing arm shaft 226 is received for rotation within through passage 216 of outer swing arm shaft 210.

FIG. 7 illustrates the way in which an upper end of inner swing arm shaft 226 is supported for rotation using a bearing/seal arrangement 228 that is essentially identical, from a functional standpoint, to the seal arrangement that is used between housing 176 and the uppermost end of outer swing arm shaft 210. It is noted that any suitable type of bearing can be used for rotationally supporting both the inner and outer swing arm shafts. Suitable bearing types include, but are not limited to angular contact and radial contact ball bearings. Bearing arrangement 228 is retained between the inner and outer swing arm shafts by attachment of lower swing arm 130 to outer swing arm shaft 210 using a plurality of threaded fasteners 230 (only one of which is shown) that are distributed around an axis of symmetry 232 of the swing arm arrangement. Hence, the lower swing arm serves as a seal and bearing retainer. Bearing 220 (FIG. 6) can also be used between the lowermost ends of the inner and outer swing arm shafts and, hence, will not be described for purposes of brevity. It is noted that upper swing arm 128 is affixed to inner swing arm shaft 226 using a clamping arrangement (FIG. 5*a*) having a clamp shell 234 (where clamp shell 234*a* is associated with first swing arm pair 124*a* and clamp shell 234*b* is associated with second swing arm pair 124*b*) which engages a clamping end of upper swing arm 128 via threaded fasteners received in clamp apertures 238 such that the rotational position of the upper swing arm can be adjusted in relation to the lower swing arm. Any number of alternatives may be employed for purposes of insuring that the swing arms interlace properly. As one example (not shown), outer swing arm shaft 210 and inner swing arm shaft 226 of swing arm assembly 124*a* can be appropriately longer than the corresponding components that are used in swing arm assembly 124*b*. As another example, an extension spacer 239 arrangement can be added, as will be described in further detail below.

With reference to FIGS. 5*a*-10*a*, attention is now directed to the configuration of the dual swing arm assembly with respect to the way in which vertical motion is achieved using cams 166. Each of these cams includes a cam mounting plate 240 (FIG. 6 and see also FIG. 5*a* where cam mounting plate 240*a* is associated with first swing arm pair 124*a* and cam mounting plate 240*b* is associated with second swing arm pair 124*b*) that is fixedly attached to a cam plate 242 such that the cams rotate with cam drive shafts 164*a* and 164*b*. FIGS. 8 and 9 illustrate the appearance of cam faces 243*a* and 243*b* of cam plates 242*a* and 242*b*, respectively, as will be further described below.

Figure 10A:
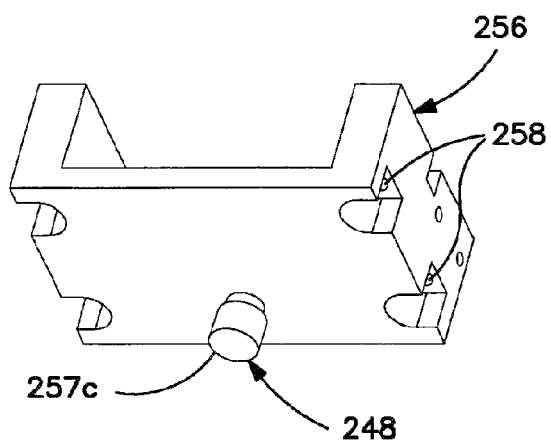
FIG. 10a is a diagrammatic view, in perspective, of a bridge bracket that supports a cam follower for engagement with the cams of FIGS. 8 and 9.
Figure 10B:
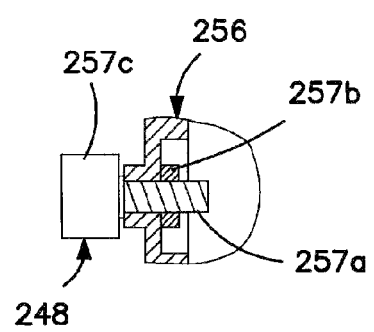
FIG. 10b is a diagrammatic partially cross-sectional view of the cam follower and a portion of the bridge bracket of FIG. 10a, shown here to illustrate further details of the structure of these components.

Referring to FIGS. 8-9, 10*a* and 10*b*, each cam plate defines a cam groove 246 which receives a cam follower 248. FIGS. 8 and 9 illustrate that cam grooves 246*a* and 246*b* are minor images of one another. Rotation of each cam moves the associated swing arms between elevations 1-4, as identified around each cam groove through engagement by cam follower 248. In FIGS. 8 and 9, the cams and, thereby, the swing arm pairs are at elevation 1, since each cam follower is received at a low point in each cam groove (as shown in phantom in FIGS. 8 and 9), although many alternative configurations can be provided. The swing arm height that is associated with each of the cam elevations will be described in conjunction with subsequent ones of the figures. It should be appreciated that cam plates 242*a* and 242*b* are interchangeable so long as such interchange is accompanied by a reversal in rotation direction. In the present example, cam plate 242*a* rotates in an indicated counterclockwise direction (CCW), while cam plate 242*b* rotates in an indicated clockwise (CW) direction. Apertures 247 are provided for use in attaching the cam plates to the cam mounting plates. FIG. 10*b* is a partially cutaway view, in partial cross-section, of cam follower 248, as it is received in a bridge bracket 256. For example, cam follower 248 includes a threaded mounting shaft 257*a* that is received in an aperture that is defined by bridge bracket 256. A nut 257*a* threadingly engages shaft 257*a*. An opposite end of shaft 257*a* supports a cam roller 257*c* for rotation. The cam roller is sized to be received in one of cam grooves 246. Such rotational support can be provided in many well-known ways such as, for example, by using a bearing (not shown). Bridge bracket 256 is connected to housing 176 (FIG. 5*a*) using threaded fasteners received in apertures 258 and includes a U-shaped configuration for purposes of bridging bracket 170 so that cam follower 248 provides vertical motion of housing 176, as limited by linear stage 172, and the swing arm shafts supported therein.

Figure 11:
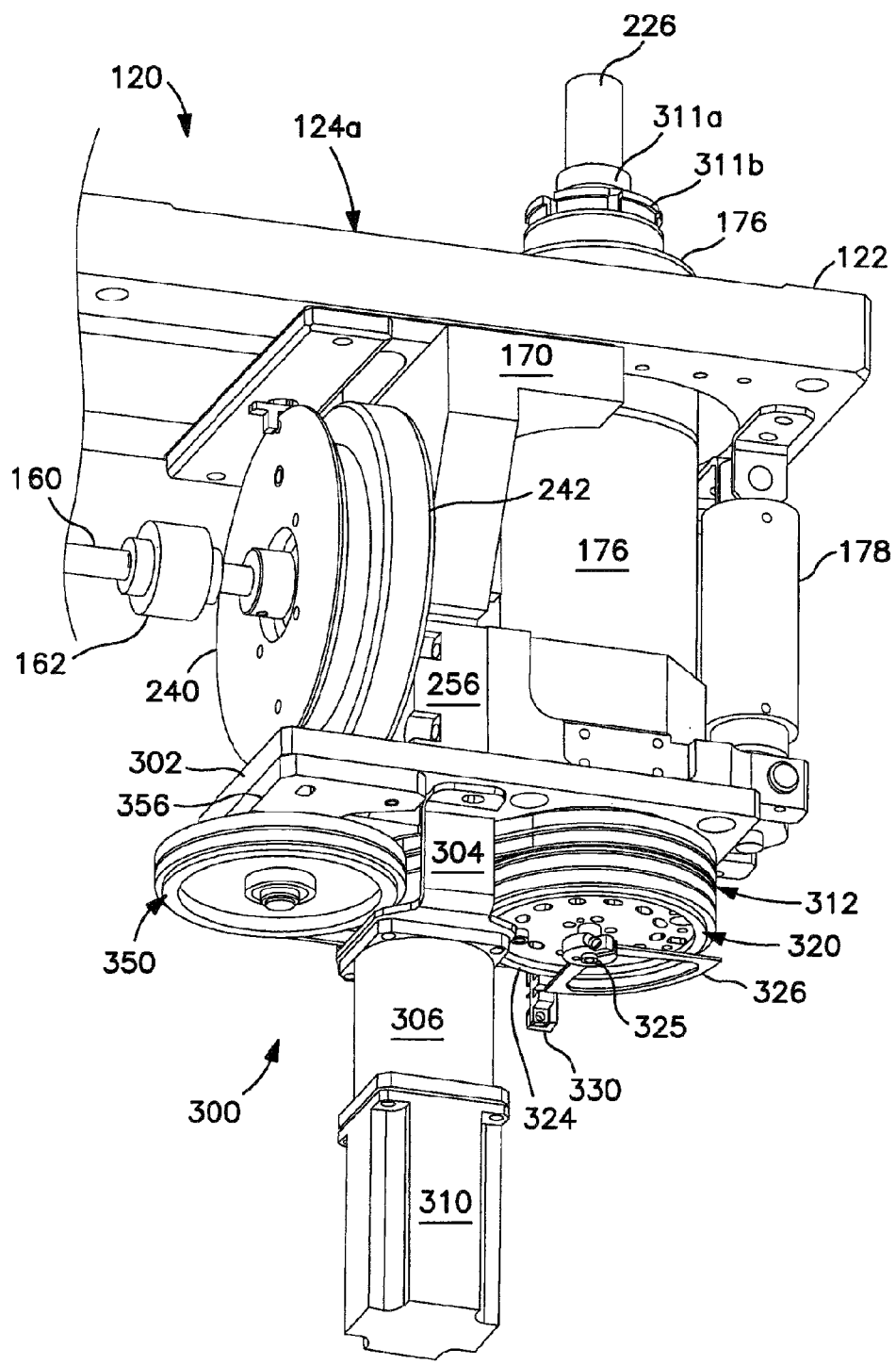
Figure 12:
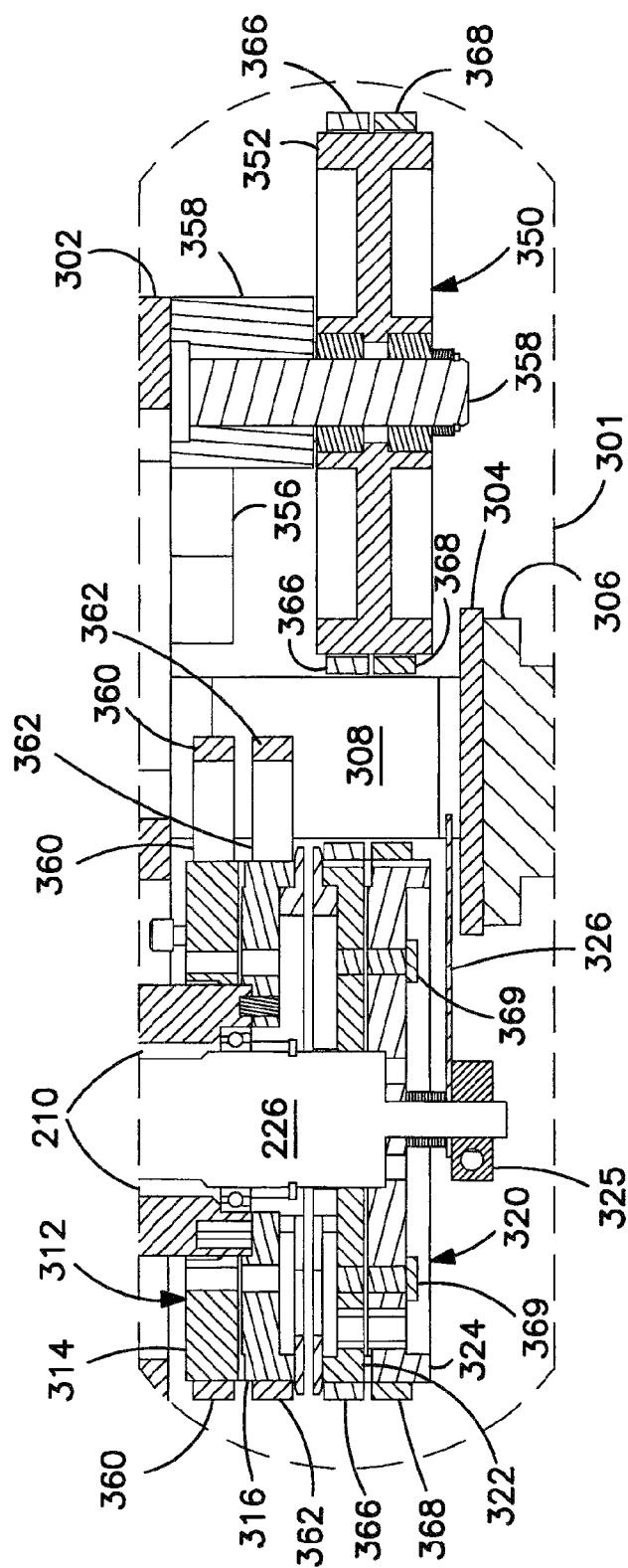
FIG. 12 is another diagrammatic enlarged cut-away view, in cross-section, of the swing arm arrangement of FIG. 6 that is further enlarged to illustrate details with respect to the swing arm drive assembly.

Referring primarily to FIGS. 6, 11 and 12, a rotational drive arrangement, generally indicated by the reference number 300 in FIG. 11, for use in counterrotating the upper and lower swing arm of each swing arm pair, will now be described in detail. FIG. 11 provides a general perspective view of this arrangement for swing arm pair 124*a* with the swing arm blades removed, while FIG. 12 provides an enlarged view within a dashed line 301, shown in FIG. 6. Drive arrangement 300 includes a drive base plate 302 that is mounted to a lowermost end of housing 176. A U-bracket 304 includes a lowermost surface to which a gear drive 306 is mounted and which is, in turn, driven by a motor 310 (FIGS. 5*a*, 6 and 11). Motor 310 may comprise any suitable type of motor such as, for example, servo or stepper motor. Gear drive 306 drives a toothed pulley 308 (FIG. 6). This latter pulley will be described in further detail below, however, for the moment, is appropriate to note that the pulley must be sufficiently long so as to be capable of simultaneously driving a plurality of four spaced apart timing belts along its overall length. Spacer arrangement 239 is shown in FIG. 11, made up of an upper swing arm spacer 311*a* and a lower swing arm spacer 311*b* in order to appropriately elevate swing arm arrangement 124*a* with respect to swing arm arrangement 124*b* to provide for the swing arm interlacing shown in FIG. 5*a*.

Referring primarily to FIG. 12, a first pulley arrangement 312 is made up of first and second side-by-side pulleys 314 and 316 that are received by the lowermost end of outer swing arm shaft 210. This latter pulley arrangement may be referred to as a split pulley arrangement. A second pulley arrangement 320 is similarly made up of first and second pulleys 322 and 324 that are received by a lowermost end of inner swing arm shaft 226. With brief reference to FIG. 11, it is noted that an arrangement of elongated apertures is defined by pulley 324 for pulley offset purposes. A clamp 325 holds a flag plate 326 in position on a reduced diameter distal end of the lowermost end of the inner swing arm shaft. The flag plate is configured to block light emitted by an optical sensor 330 (FIG. 11) that is mounted to base plate 302 over an angular displacement that is equal to the total angular movement of upper swing arm 128*a* between the workpiece column and its corresponding process station. A third, idler pulley arrangement 350 includes a pulley 352, configured for receiving belts 366 and 368, which is itself rotationally supported by an idler pulley mount 356 that adjustably engages base plate 302 such that pulley 352 rotates on an idler pulley shaft 358. In this regard, both gear drive 306 and pulley mount 356 are mounted in a way which provides for a degree of pivotal rotation, generally in the manner described above with respect to lift motor 152 of FIG. 5*a*, for example, using fasteners which pass through slotted holes in a manner that is known in the useful arts. Such pivotal rotation is useful for purposes of adjusting belt tension, as will be described immediately hereinafter.

Still referring primarily to FIG. 12, four belts are rotated by driven pulley 308. A first pair of lower swing arm timing belts includes a lower arm leading belt 360 and a lower arm lagging belt 362 that engage pulleys 314 and 316, respectively. A second pair of upper swing arm timing belts includes an upper arm leading belt 366 and an upper arm lagging belt 368. The reason for the use of "lagging" and "leading" nomenclature applied in naming these belts will be made apparent below. Suitable belts for use in this application, including lift belt 156 of FIG. 5*a*, should be formed from materials resistant stretching such as, for example, polyurethane and/or Kevlar reinforced neoprene. A pair of bolts 369 (FIG. 12) is illustrated for holding pulleys 322 and 324 in a fixed rotational offset.

Figure 13:
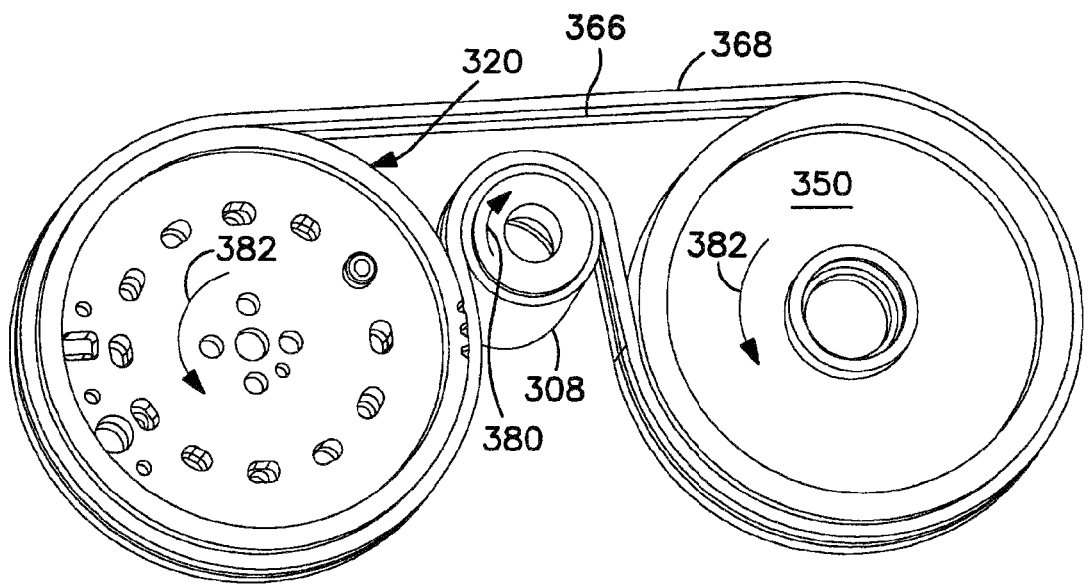
FIG. 13 is a diagrammatic perspective view illustrating a counter rotation drive belt and pulley arrangement that is used to counter rotate one swing arm of a coaxial pair of swing arms.
Figure 14:
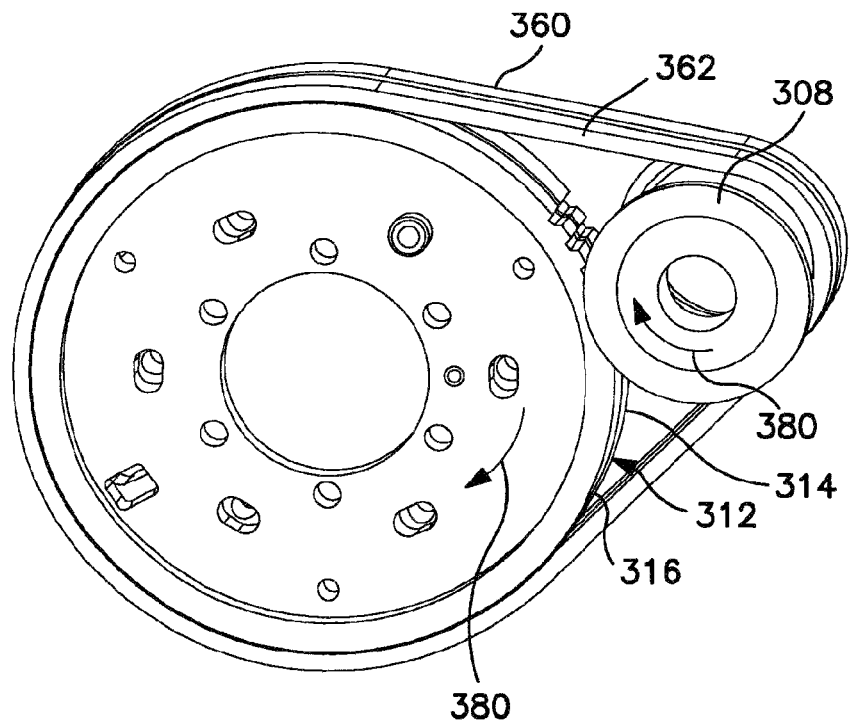
FIG. 14 is a diagrammatic perspective view illustrating a drive belt and pulley arrangement that is used to rotate the other swing arm of the coaxial pair of swing arms.

Turning now to FIGS. 13 and 14 in conjunction with FIG. 12, attention is now directed to the arrangement of the belt drive shown in FIG. 12, as it appears in diagrammatic perspective views, taken from below, for purposes of generally illustrating the paths taken by the belts. To that end, FIG. 13 illustrates pulley arrangements 320 and 350 in relation to driven pulley 308, as engaged by belts 366 and 368. It is noted that teeth have been illustrated on only a portion of the pulleys for purposes of simplicity, although it is to be understood that each pulley includes an essentially identical toothed configuration that is matched by all of the belts in use. Each of pulley arrangements 320 and 312 includes a pattern of elongated slots for receiving threaded fasteners (see bolts 369 of FIG. 12) in order to fixedly offset the tooth pattern of each pair of pulleys, for reasons which will be made apparent.

It should be appreciated that belts 366 and 368 are configured having teeth on both opposing major surfaces of the belts. Therefore, the "front side" of each belt engages pulley arrangements 320 and 350 while the "back side" of each belt engages driven pulley 308. Accordingly, in the instance where driven pulley 308 rotates clockwise as indicated by an arrow 380, pulley arrangements 320 and 350 will rotate counterclockwise, as indicated by an arrow 382.

FIG. 14 illustrates pulley arrangement 312 in relation to driven pulley 308, as engaged by belts 360 and 362. In this case, clockwise rotation of driven pulley 308 produces clockwise rotation of pulley arrangement 312. Therefore, pulley arrangements 312 and 320 coaxially counterrotate with respect to one another, since all of the pulley arrangements are driven by a common driven pulley 308. Therefore, because pulley arrangement 312 is supported by outer swing arm shaft 210, while pulley arrangement 320 is supported by inner swing arm shaft 226, the inner and outer swing arm shafts, likewise, counterrotate with respect to one another responsive to any rotation of driven pulley 308.

Referring briefly to FIGS. 5*a* and 6, the reader will recall that outer swing arm shaft 210 supports one of lower swing arms 130, while inner swing arm shaft 226 supports one of upper swing arms 128. The upper and lower swing arms of each swing arm pair 124, therefore, counterrotate with respect to one another by an equiangular amount for any given rotation of pulley 308. In this regard, it is noted that flag plate 326 (FIG. 11) co-rotates with inner swing arm shaft 226. As a result of the counter rotation configuration that is used, after initial alignment, identification of the position of the inner swing arm shaft also causes the position of the outer swing arm shaft to be known. As should be evident in the context of this application for driving swing arms, no more than one full revolution of each swing arm is required and, generally, significantly less than one revolution is often the requirement. In the present example, each swing arm rotates approximately +/−60 degrees from a center or home position, thereby exhibiting a total rotation of approximately twice that value. The swing arm arrangement of the present invention advantageously provides for adjustment of the overall angular displacement in view of a particular installation, as will be further described in detail at appropriate point hereinafter.

Figure 15:
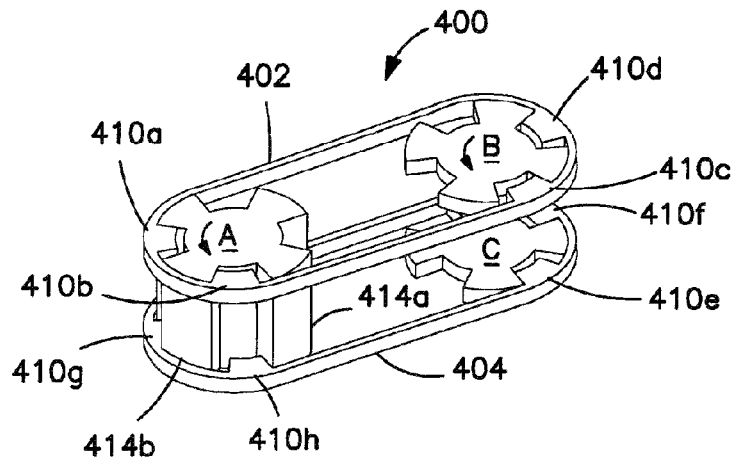
FIG. 15 is a simplified illustration, in perspective, of a drive belt and pulley arrangement that is used for purposes of minimizing drive belt backlash.

Referring now to FIG. 15, a simplified example will now be provided for purposes of explaining the backlash compensation concept of the present invention using a diagrammatic perspective view of a pulley arrangement that is generally indicated by the reference number 400. The latter is made up of pulley A, pulley B and pulley C. Pulley A is driven by a suitable arrangement such as, for example, a motor (not shown) and functions in a manner that is similar to that described above with respect to pulley 308 of FIG. 12, wherein the pulley is sufficiently elongated so as to support a plurality of spaced apart toothed belts. All of these pulleys include an identical tooth receiving pattern.

Figure 16A:
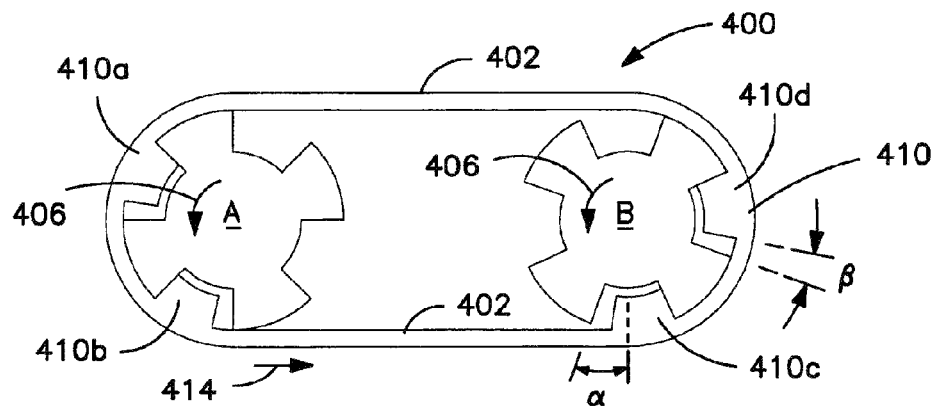
FIGS. 16a and 16b are diagrammatic plan views of the drive belt and pulley arrangement of FIG. 15, shown here to illustrate further details with respect to its arrangement.
Figure 16B:
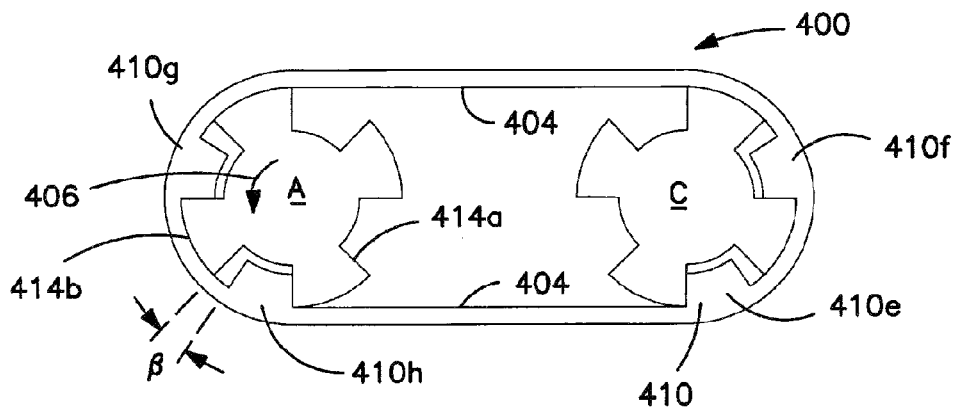

Referring to FIGS. 16a and 16b, in conjunction with FIG. 15, pulleys B and C are mounted on a common shaft, which has not been shown for purposes of illustrative clarity, such that the tooth receiving pattern of pulley B is offset with respect to that of pulley C which may be accomplished for example using a elongated slot aperture configuration, as described above. This offset may be on the order of the backlash value that is present between one of the pulleys and its engaging belt. It is noted that the backlash value has been exaggerated in the figures for illustrative purposes. Such a value may be specified, for example, by a manufacturer. In the present example, a backlash value of approximately 0.02 inch is seen. Therefore, the offset between the pulleys may be set to this value or slightly less. Depending on a particular direction of rotation, one of the belts or pulleys may be described as leading or lagging the other belt, as mentioned above. Of course, the relative leading/lagging phase of the respective belts may be reversed by simply rotationally offsetting the pulleys in an opposite direction with respect to one another.

Still referring to FIGS. 15, 16a and 16b, in the present example, a belt 402 engages pulleys A and B, while a belt 404 engages pulleys A and C. Pulley A is being rotated in a counterclockwise direction as is indicated by an arrow 406. For purposes of simplicity, only a limited number of teeth 410 have been illustrated on belts 402 and 404. It is noted that the present figures illustrate the pulley arrangement at a given point in time such that pulley A is in the same rotational position in all of the figures. Pulleys B and C are understood to be coaxially mounted in a way which provides for adjustment of an angular offset therebetween. It is considered that one of ordinary skill in the art is capable of implementing such an offset arrangement in view of this overall disclosure. The angular offset is indicated by an offset angle α that is shown in FIG. 16a. In this example, pulley C leads pulley B by angle α. The backlash value is illustrated by an angle β in FIG. 16a. In the present example, the offset angle has been shown as approximately double the backlash value to compensate for backlash that is introduced by belts 402 and 404.

Still considering pulley arrangement 400, teeth 410a and 410b of belt 402 are engaged by pulley A (FIG. 16a) thereby causing belt 402 to move in a direction indicated by an arrow 414. Responsive to movement of belt 402, teeth 410c and 410d engage pulley B to cause it to rotate in counterclockwise direction 406. Pulley C (FIG. 16b) co-rotates with pulley B such that it engages belt teeth 410e and 410f. This action, in turn, causes teeth 410g and 410h of belt 404 to engage pulley A so that a leading edge of each belt tooth rotates pulley A. In this way, backlash angle β trails belt teeth 410g and 410h, as illustrated in FIG. 16b with respect to belt tooth 410g. Subsequently, when pulley A reverses to clockwise rotation, belt teeth 410g and 410h will immediately be engaged by pulley teeth 414a and 414b, respectively, of pulley A. Responsive thereto, belt teeth 410e and 410f will immediately engage pulley teeth 414c and 414d of pulley C in a clockwise direction such that backlash is eliminated, at least from a practical standpoint. At the same time, tension transfers from belt 402 to belt 404. It is to be understood that this highly advantageous configuration, while being described in the context of driving counter rotating swing arms, is not limited to the applications described herein but may enjoy a wide range of applicability in virtually any situation where it is desired to eliminate backlash arising from the use of toothed pulleys and flexible drive members.

Figure 17A:
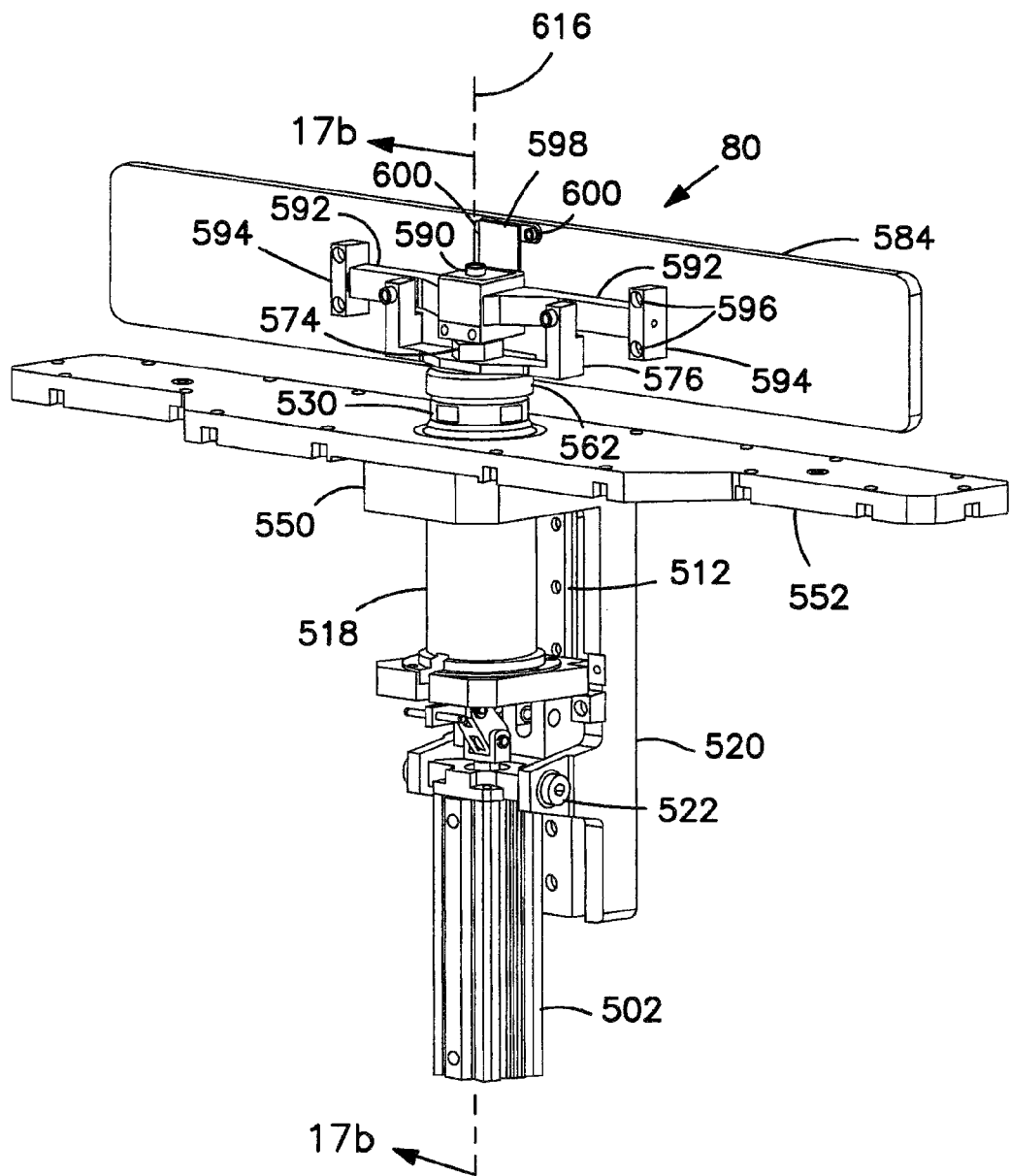
FIG. 17a is a diagrammatic view, in perspective, illustrating a slot valve arrangement that is produced in accordance with the present invention.
Figure 17B:
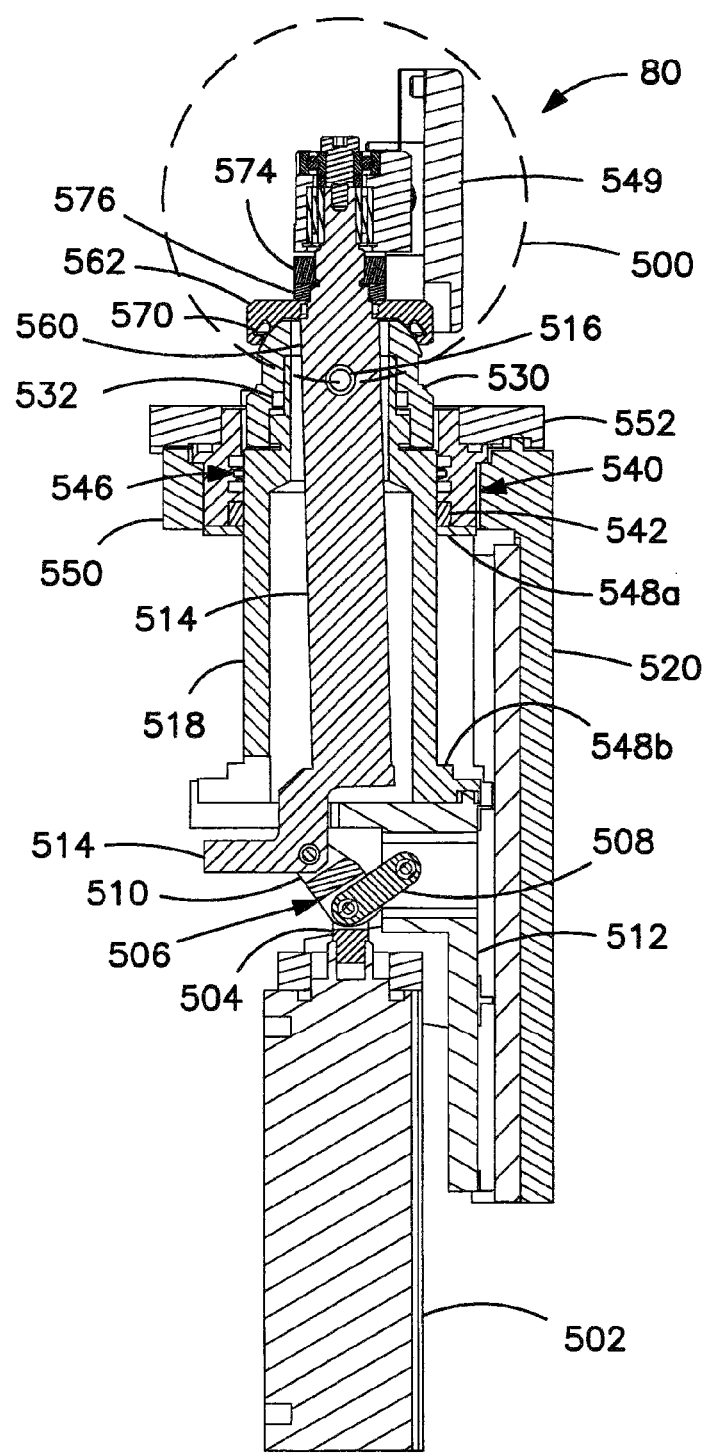
FIG. 17b is a diagrammatic view, in cross-sectional elevation, showing the slot valve arrangement of FIG. 17a to illustrate further details of its structure.
Figure 17C:
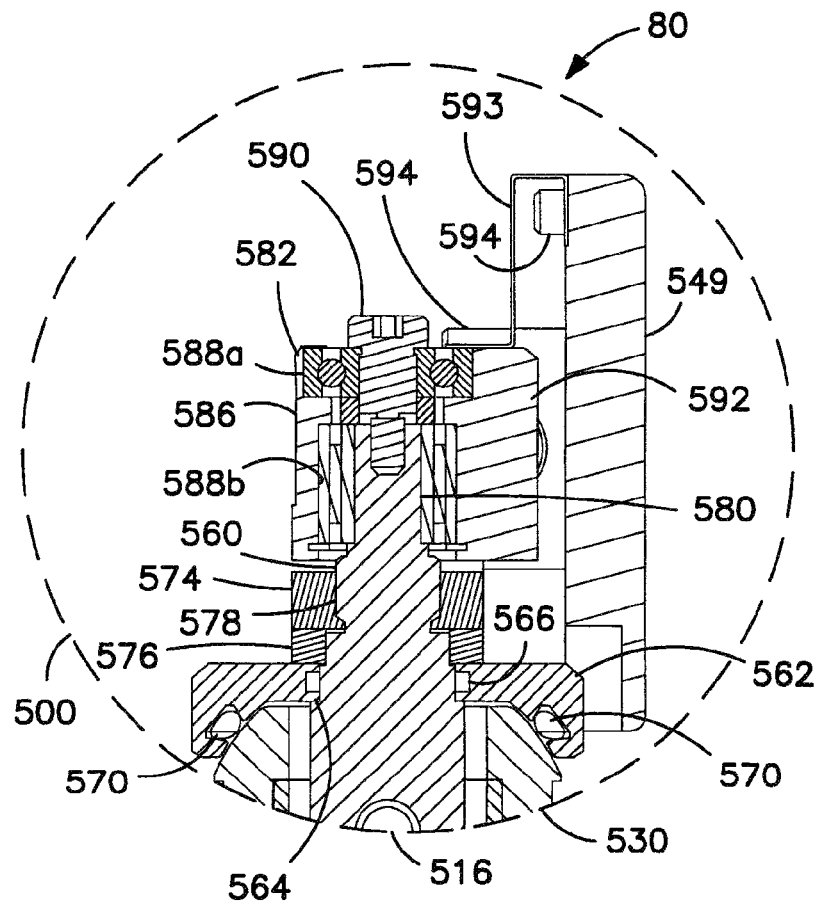
FIG. 17c is a diagrammatic partially cut-away view, in cross-sectional elevation, showing an enlarged region of the view of FIG. 17b, illustrating still further details of its structure.
Figure 17D:
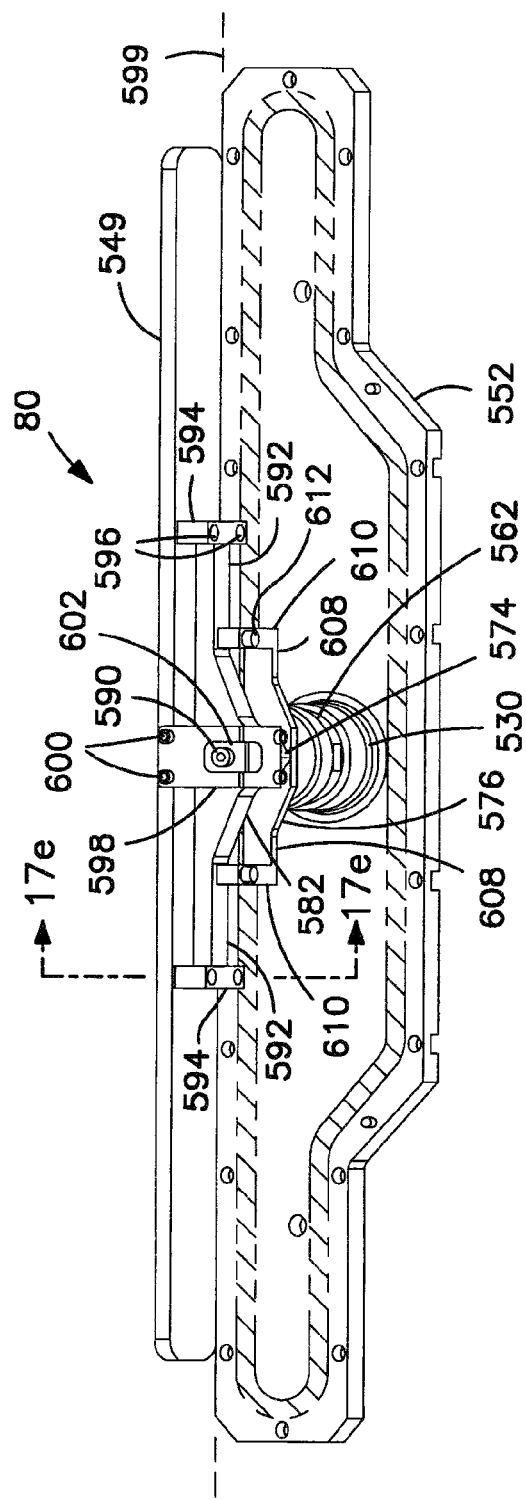
FIG. 17d is a diagrammatic view, in perspective, of the slot valve arrangement of FIG. 17a illustrating further details with respect to a blade suspension mechanism.

Referring generally to FIGS. 17a through 17d, attention is now directed to details with regard to slit door valve arrangement 80, which was previously shown in FIGS. 3 and 4. FIG. 17 provides a prospective view of slit door arrangement 80, while FIG. 17b is a diagrammatic cross-sectional view taken along a line 17b-17b shown in FIG. 17a. FIG. 17c is a further enlarged view of a portion of the slit door valve arrangement within an area 500, indicated by a dashed line in FIG. 17b. FIG. 17d is a perspective view, looking angularly downward on an upper portion of arrangement 80.

Referring to FIGS. 17a and 17b, slit door valve arrangement 80 includes a linear actuator 502 such as, for example, a pneumatic linear actuator. This actuator includes a drive shaft 504 that is capable of vertical movement in the view of these figures. Shaft 504 is connected to a linkage arrangement 506 that is comprised of a first link 508 and a second link 510. One end of first link 508 is pivotally attached to a slide bracket 512 while its opposing end is pivotally attached to shaft 504. Link 510 includes one end that is pivotally attached to a blade lever 514 and an opposing end that is pivotally attached to shaft 504. Blade lever 514 is supported at an axle 516 within a pivot shaft 518 such that lever 514 can be rotated about axle 516 within pivot shaft 518 responsive to movement of the lowermost end of the lever produced by linkage arrangement 506, as will be described. Pivot shaft 518 is supported by linear slide 512 which, in turn, slidingly engages a fixed bracket 520. Bracket 520 also supports actuator 502 in a suitable manner such as through the use of an appropriate fastener 522, so that the actuator is positionally fixed for applying movement forces to blade lever 514 via linkage 506. Accordingly, lever 514 can be moved upward and downward responsive to actuator 502. Movement forces are then transferred to pivot axle 516 through the length of the blade lever which, in turn, causes pivot shaft 518 to move in concert with the blade lever. An uppermost end of pivot shaft 518 sealingly receives a ball flange 530. Sealing can be accomplished, for example, using an O-ring received within an annular groove 532. Ball flange 530 can be fixedly attached to pivot shaft 518 in any suitable manner such as, for example, by threaded engagement. A sealing and guiding arrangement 540 includes an annular bushing 542 which serves to constrain nonvertical movements of pivot shaft 518. A sealing arrangement 546 is positioned immediately above bushing 542 for sealing against pivot shaft 518. Any suitable sealing arrangement may be utilized including, for example, the quad seal arrangement described above with regard to FIG. 7. During operation, upward movement initially causes the blade lever to move upward, without rotation, until a peripheral cover hard stop 548*a* (FIG. 17*b*), encounters a pivot shaft stop step 548*b*, and limits any further vertical rise. At this point, links 506 and 508 pivot in a way which rotates the lower end of blade lever 514 clockwise in the view of FIG. 17*b*. A sealing blade 549 responsively advances to contact a confronting chamber sealing surface (see FIG. 3). The sealing blade and other components may be formed from any suitable material such as, for example, the particular material that the engaged chamber body is formed and aluminum. Downward motion of pivot shaft 518, of course, results in an opposite behavior of the mechanism.

Referring again to FIGS. 17*a*-17*d*, sealing and guiding arrangement 540 (FIG. 17*b*) is received in an uppermost opening that is defined by an upper end 550 (FIG. 17*a*) of bracket 520. In this regard, it is noted that bracket 520 includes a general inverted L shape. Upper end 550 of bracket 520 is attached to an adapter plate 552 in any suitable manner such as, for example, using threaded fasteners (not shown). It should be appreciated that an uppermost end 560 of lever 514 can move laterally, in the view of the figure, with pivotal motion of the lever in relation to ball flange 530. Therefore, an appropriate sealing arrangement must be provided between uppermost lever end 560 and ball flange 530. To this end, a socket cap 562 is received around upper lever end 560 against an annular step 564 defined thereby. Socket cap 562 is sealed against uppermost lever end 560, for example, using an O-ring that is received in an annular groove 566. An outermost annular periphery of socket cap 562 is sealed against ball flange 530 using an O-ring 570 (FIG. 17*c*) that is received within an annular groove 572. A jam nut 574, or other suitable mechanical expedient, is used to retain socket cap 562 against ball flange 530 while capturing an alignment yoke 576 therebetween. Jam nut 574 can be threadingly received on an enlarged diameter, threaded portion 578 of uppermost end 560 of lever 514. In the current embodiment, jam nut 574 is tightened until it reaches hardstop. This ensures that the position of socket cap 562 is held in toleranced proximity to ball flange 530. Ideally, the spherical surfaces exhibited by both the socket cap and ball flange share a common center point. The ball and socket sealing configuration provided by this configuration is considered to be advantageous with respect to accommodation of significant lateral movement, while maintaining a seal between ball flange 530 and socket cap 560.

Figure 29:
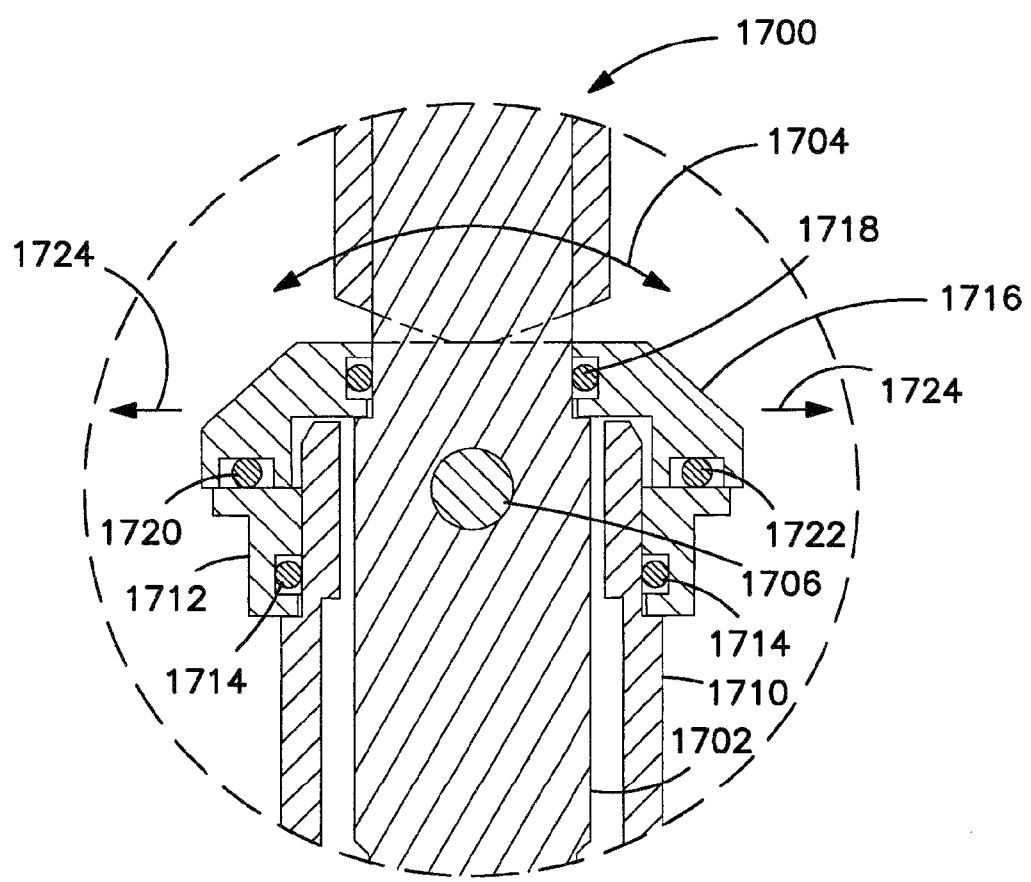
FIG. 29 is a diagrammatic partially cutaway cross-sectional view, in elevation, of one embodiment of a prior art slit door arrangement, shown here to illustrate details of its sealing configuration.

As compared to the prior art, embodied, for example, by slit door 1500 of FIG. 29, slit door arrangement 80 accommodates more pivotal movement which allows for increased movement away from sealing surface which, in turn, reduces the possibility of rubbing contact during the vertical motion phase. Still further advantages are provided with dual degree of motion capability so as to avoid a need for precise installation adjustments.

Referring primarily to FIGS. 17*a*, 17*c* and 17*d*, uppermost lever end 560 includes a distal end 580 (FIG. 17*c*) which supports a blade suspension member 582, in turn, for supporting sealing blade 549. Blade suspension member 582 is itself pivotally supported on distal end 580 using first and second bearings 588*a* and 588*b*, respectively. These bearings are configured for providing rotational movement of the suspension stage. First bearing 588*a*, in the present example, is a ball bearing, while second bearing 588*b* is a needle bearing. It is contemplated that any number of alternative bearing arrangements may be used for supporting blade suspension member 582, so long as appropriate pivotal motion is achieved in conjunction with the capability to transfer sufficient radial force. The suspension member and bearing 588 are held to distal end 580, for example, by using a shoulder screw 590 which threadingly engages the distal end and retains bearings 588*a* and 588*b*. Suspension member 582 includes a pair of laterally extending suspension arms 592 (FIGS. 17*a* and 17*d*). Distal ends of arms 592 are pivotally received in pivot blocks 594 that are fixedly attached to a backside surface of sealing blade 549, for example, using threaded fasteners (not shown) that are received in a pair of openings 596 and extend into sealing blade 549 in a familiar manner. A pitch biasing spring 598 is attached at one end using fasteners 600 to blade 549. The pitch biasing spring, as best seen in FIG. 17*d*, then wraps around suspension member 582 for attachment to a surface thereof which is opposite sealing blade 549, using another pair of fasteners 600. A cut-out area 602 (FIG. 17*d*) of the biasing spring provides an access margin for shoulder screw 590. While spring 598 is shown attached to a rearward facing surface of blade member 549 in FIGS. 17*a-c* and 17*e*, it can be designed for attachment to an upper surface of the blade member, as is shown in FIG. 17*d*, depending on the sealing blade geometry and clearance requirements in a particular application. It is noted that pitch biasing spring 598 maintains a desired rotational position of blade 549 with respect to rotation about an axis 599 (indicated by a dashed line in FIG. 17*a*) of blade suspension member 582 when valve arrangement 80 is in its open position. That is, this desired rotational position is invoked when blade member 549 is not contacting or draws away from a chamber wall sealing surface surrounding a slit opening (see FIG. 3). On the other hand, when blade member 549 contacts such a chamber wall sealing surface, pitch biasing spring 598 allows pivotal rotation about axis 599 of suspension member 582 such that the blade member rotates to accommodate a vertical tolerance between the blade member and the chamber wall, in order to provide an acceptable seal without a need for precision tolerance adjustments.

Referring to FIGS. 17*a* and 17*d*, yoke 576 includes opposing arms 608 (FIG. 17*d*) having vertically extending distal ends 610, each of which defines a through opening for receiving a threaded fastener 612 which threadingly engages arms 592 of suspension member 582.

Figure 17E:
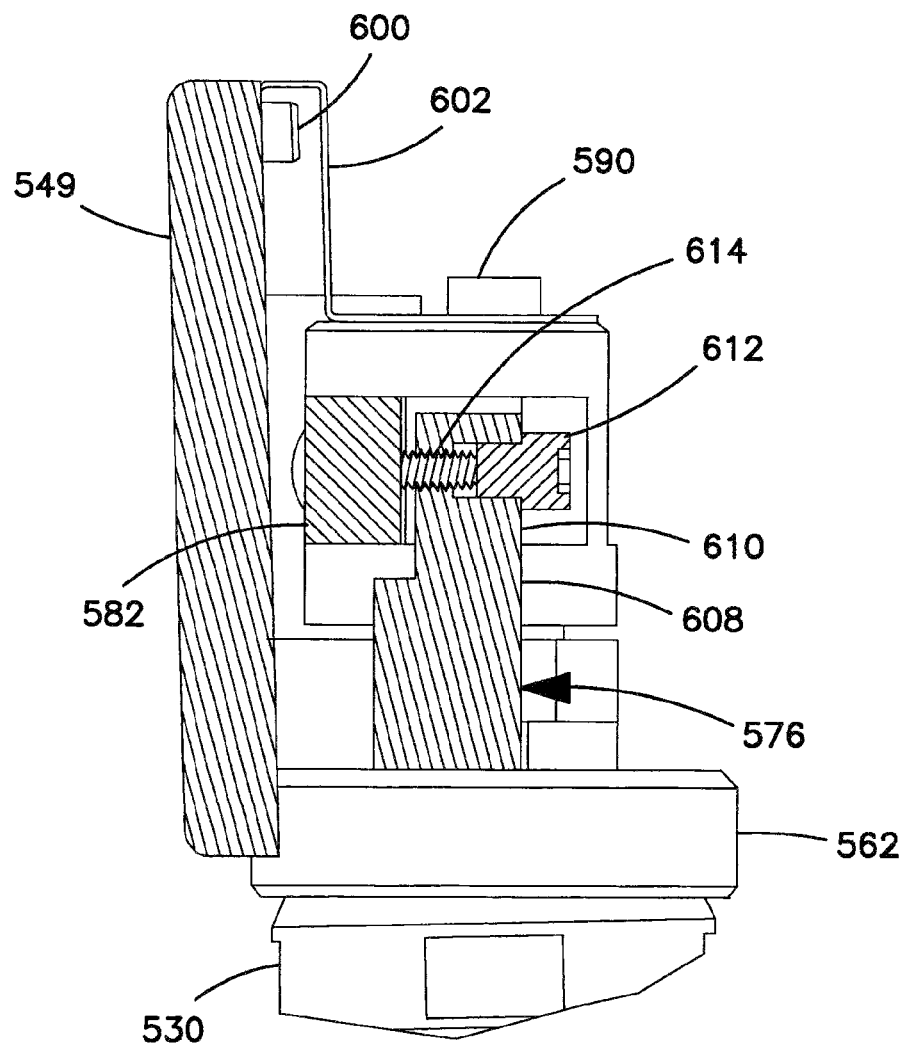
FIG. 17e is a diagrammatic view, in cross-section, illustrating details with respect to one feature of the blade suspension mechanism.

As seen in FIG. 17*e*, which is a cross-sectional view that is taken along a line 17*e*-17*e* in FIG. 17*d*, biasing springs 614 are captured by fasteners 612 between each distal end 610 of yoke 576 and each one of the suspension arms to resiliently bias each distal end 610 away from its associated suspension arm 592. Springs 614 thereby serve in an advantageous manner so as to center blade member 549 with respect to rotation about an axis 616 (indicated using a dashed line in FIG. 17*a*) of lever 514 when the blade member is not contacting a chamber sealing surface. When the chamber sealing surface is contacted by the blade member, however, springs 614 accommodate limited rotation of the blade member about lever 514 in order to compensate for a lateral or horizontal tolerance between blade member 549 and a chamber sealing surface by rotating about axis 616. Thus, the configuration of valve arrangement 80 advantageously provides for two degrees of freedom for blade member 549, as it engages a chamber sealing surface so as to avoid a need for high precision alignment, since a significant range of tolerance range can be compensated with respect to the vertical and horizontal axes of rotation. For example, assembly variations of approximately 0.100 inch are permissible. Moreover, it should be appreciated that the "ball and socket" configuration provided by ball flange 530 and socket cap 562 accommodates substantial lateral movement of blade member 549 toward and away from the chamber sealing surface. In this way, substantial lateral movement, prior to vertical movement of the sealing blade, allows increased rotational tolerances and/or relatively larger sealing blades, provided by significantly greater clearance between the chamber wall and sealing blade during vertical movement so as to avoid rubbing contact which can generate particles.

Figure 18B:
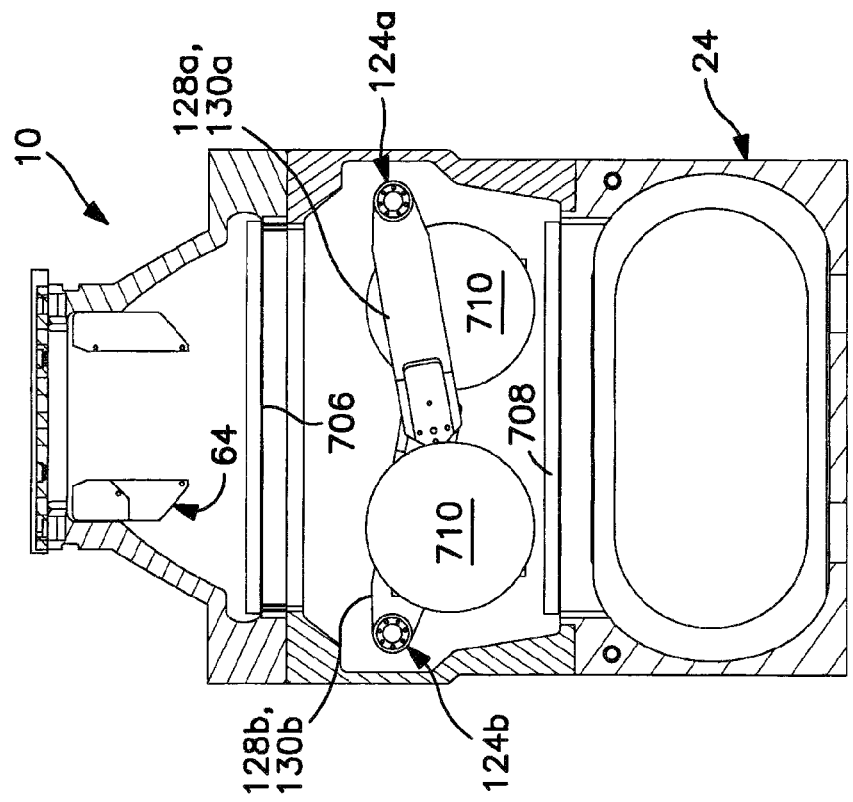
FIGS. 18a-18e form a series of diagrammatic plan views illustrating one process for implementing workpiece transfer and treatment in a highly advantageous way.

Having described the various components of system 10 in detail above, attention is now directed to the operation of the system, with particular regard to the use of the swing arm arrangement of the present invention. A first series of FIGS. 18a-e diagrammatically illustrate system 10 in a plan view, sequentially showing transfer of workpieces with ongoing processing. This first series of figures is supplemented by a second series of FIGS. 19a-l which diagrammatically illustrate sequential movements of the workpieces in an elevational view with ongoing processing. For purposes of simplicity, the present description may refer to workpieces as wafers. Most of the subject figures are limited to illustrating the combination of one loadlock 20, interfaced with one transfer chamber 22 which is, in turn, interfaced with one process chamber 24 having dual process stations 26a and 26b. Components of front end 12 will be illustrated as necessary. A workpiece or wafer column 700 is positioned in loadlock 20, as defined by shelf arrangement 64 of FIGS. 2 and 4. As seen in FIG. 19a, workpiece column 700 includes a pair of preprocess shelves 702 and a pair of postprocess shelves 704. In this regard, it should be appreciated that preprocess wafers are always moved from the front end to preprocess shelves 702 and postprocess wafers are always moved from postprocess shelves 704 back into the front end. Slit doors are indicated as being closed between the various chambers, as needed, using rectangles in the FIG. 18 series and using cross-hatching in the FIG. 19 series. For example, slit doors 706 and 708 are open in FIGS. 18a-d and FIGS. 19-a-g and 19l, while being shown as closed in FIG. 18e and FIGS. 19h-k. FIGS. 18b, 18d and 18e, as well as FIGS. 19c, 19d and 19g-l further illustrate the swing arm arrangement in a home or parked position at some point during ongoing operation of the system, as will be further described.

Figure 18A:
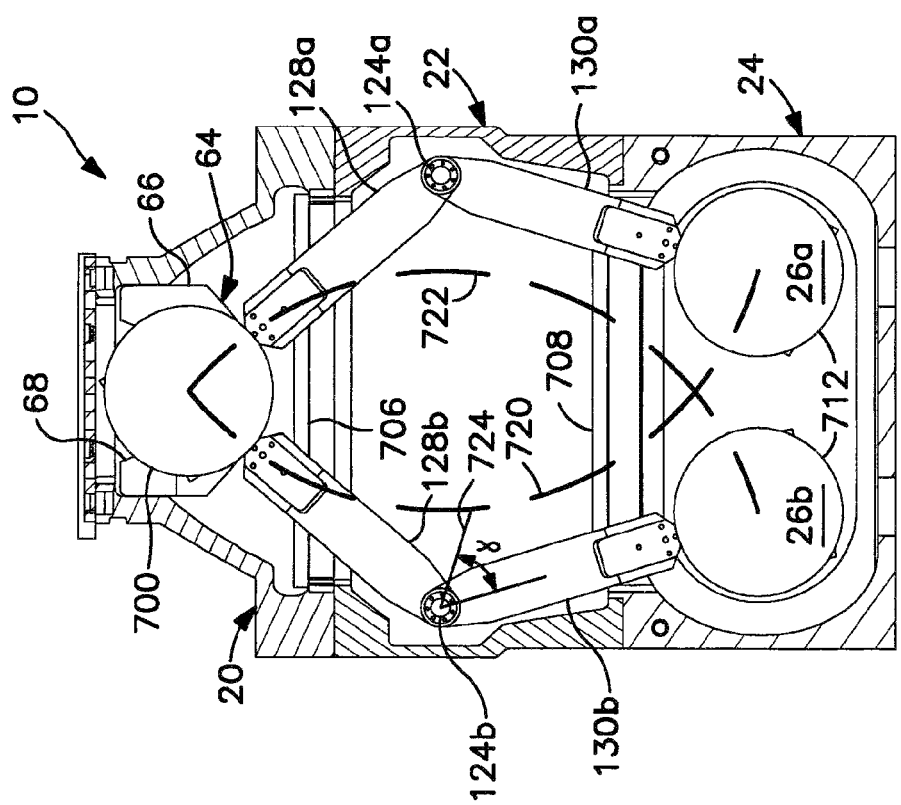

Turning to FIG. 18a in conjunction with FIG. 19a, the latter figure, as is the case with all of the figures in the FIG. 19 series, is an elevational view of system 10 having workpiece column 700 shown at the left and process stations 26 at the right in the view of the figure. An upper swing arm pair, as previously described with regard to FIG. 5a, includes swing arms 128a and 128b, for use in moving preprocess wafers while a lower swing arm pair includes swing arms 130a and 130b, for use in moving postprocess wafers. Upper swing arms 128 are rotated to workpiece column 700 while lower swing arms 130 are rotated to process stations 26. In FIG. 19a, upper swing arms 128 are poised to lift a pair of preprocess wafers 710 from preprocess shelves 702 while swing arms 130 are concurrently poised to lift a pair of postprocess wafers 712 at process stations 26a and 26b. It is noted that elevation 4 in FIGS. 8 and 9 produces this swing arm height. Postprocess wafers 712 are supported at different, spaced apart heights h1 and h2, respectively, above the process stations by first and second sets of lift pins 716 and 718 such that lower swing arms 130 are poised to pick postprocess wafers 712 from the lift pins.

Referring to FIG. 18a, it should be appreciated that the preprocess and postprocess wafers are moved along first and second arcuate, semicircular transfer paths 720 and 722, indicated by dashed lines, between workpiece column 700 and process stations 26. It is of interest that paths 720 and 722 intersect at workpiece column 700, but cross one another, thereby intersecting again, near the process stations. An angle γ represents the rotation of each swing arm from a home position, corresponding to the position of a dashed line 724, along paths 720 and 722. Thus, the full travel of each swing arm between workpiece column 700 and its associated process station 26 is 2γ. It is of further interest that the wafer column, pivot axes of the two swing arm arrangements and the two process stations cooperatively define a pentagonal shape. An uppermost shelf of shelf arrangement 64 is partially visible, comprising one long blade 66 and one short blade 68 (also see FIG. 2). These blades are arranged in a way that accommodates a particular angle of entry by the swing arm that services a particular shelf so as to avoid interference therebetween. In the present example, upper swing arm 128a accesses the uppermost shelf. Short blade 68 is therefore positioned on the left side of the shelf arrangement, in the view of the figure to prevent interference with end effector 142a of upper swing arm 128a. Since upper swing arm 128b swings-in from an opposite direction with respect to upper swing arm 128a, the shelf blades are reversed for its associated shelf, as can best be observed in FIG. 2. Thus, the shelf blade configuration is customized in view of the approach angle of each accessing swing arm.

In FIG. 19b, swing arm pairs 124a and 124b have executed an upward vertical motion, using lift motor 152 of FIG. 5a, so as to use upper swing arms 128 to lift preprocess wafers 710 off of preprocess shelves 702, while using lower swing arms 130 to lift postprocess wafers 712 off of lift pins 716 and 718. It is noted that rotation of cam plates 242a and 242b of FIGS. 8 and 9, respectively, from elevation 4 to elevation 1 produces this upward vertical movement.

Turning to FIGS. 18b and 19c, swing arms 128a, 128b, 130a and 130b all rotate simultaneously to the home position such that preprocess wafers 710 and postprocess wafers 712 are in a spaced apart vertical relationship (FIG. 19c), but only the preprocess wafers are visible in the view of FIG. 18b. Cam plates 242a and 242b of FIGS. 8 and 9, respectively, remain at elevation 1.

Referring to FIG. 19d in conjunction with FIG. 18b, while the swing arms remain in the parked position, a downward vertical movement in a direction indicated by an arrow 730 is executed, responsive to lift motor 152 of FIG. 5a. It is noted that lift pins 716 and 718 can remain in their "up" position, as also shown in FIG. 19c. It is noted that rotation of cam plates 242a and 242b of FIGS. 8 and 9, respectively, from elevation 1 to elevation 2 produces this downward vertical movement.

Figure 18C:
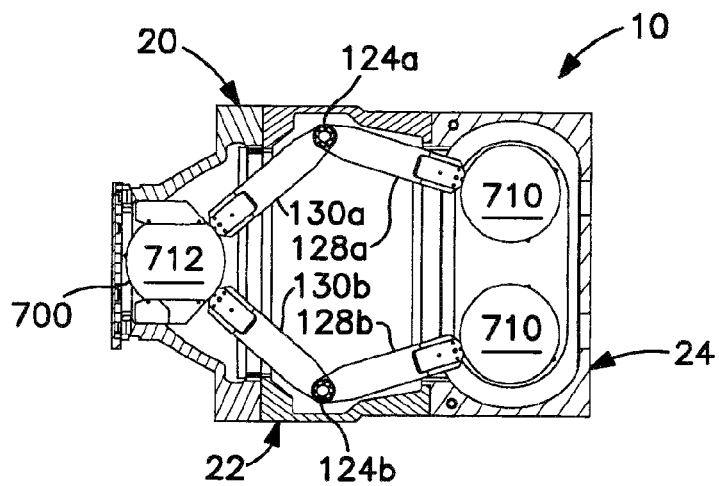
Figure 18D:
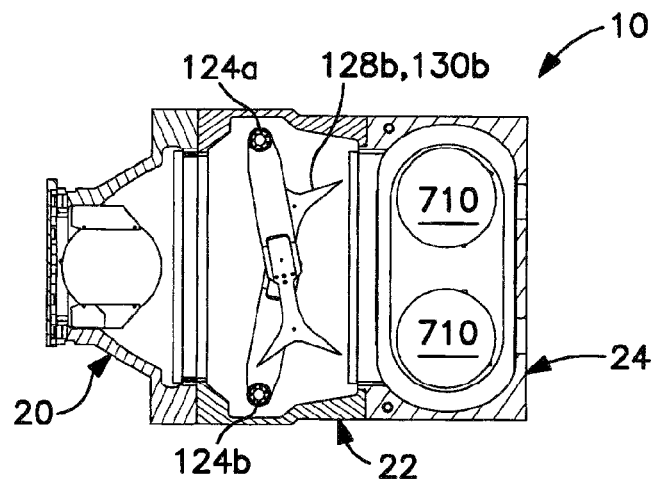
Figure 18E:
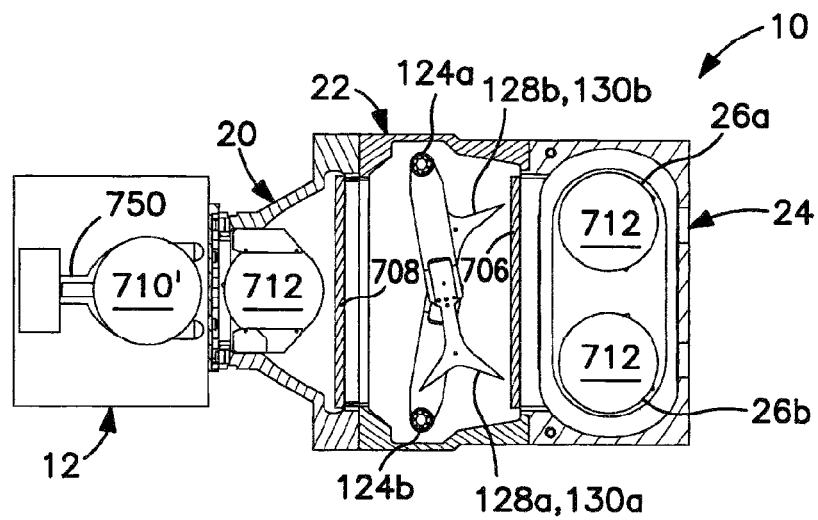

FIGS. 18c and 19e, cooperatively illustrate the result of rotation of lower swing arms 130a and 130b to wafer column 700 to deliver post process wafers 712 while upper swing arms 128a and 128b each deliver one preprocess wafer 710 to one of process stations 26a and 26b. Lift pins 716 and 718 can remain in their up positions, while cam plates 242a and 242b of FIGS. 8 and 9 remain oriented at elevation 2.

In FIG. 19f, the swing arm arrangement is moved downward in a direction indicated by an arrow 740 to place preprocess wafers 710 on lift pins 716 and 718 while postprocess wafers 712 are placed on postprocess shelves 704. It is noted that rotation of cam plates 242a and 242b of FIGS. 8 and 9, respectively, from elevation 2 to elevation 3 produces this downward vertical movement. Further, returning post-process workpieces entails a reversal of rotation of cam plates 242a and 242b, as will be evident to one having ordinary skill in the art in view of the foregoing disclosure.

FIGS. 18d and 19g illustrate swing arms 128a, 128b, 130a and 130b, then rotated to the home position. At this point, the swing arms are not carrying wafers and lift pins 716 and 718 remain raised to support preprocess wafers 710.

Referring to FIGS. 18e and 19h, it is noted that the former figure illustrates a front end robot 750 that is configured for moving wafers between loadlock 20, FOUPs 18 and intermediate station 21 (FIG. 1b) in the front end. It is noted that intermediate station 21 can be used for a variety of different functions including a cooling station, a wafer alignment station, a pre- and/or post process metrology station or two or more functions can be incorporated into this space. The front end robot arm supports a pair of wafers, using an over/under pair of paddles, and is configured for placing on preprocess shelves 702 and picking from post process shelves 704. Of course, the front end robot arm can pick and place from any pair of adjacent positions or from any individual position in any FOUP or any position in cooling station 21 (FIG. 1b). In the present example, front end robot 750 is poised to deliver a new pair of preprocess wafers 710' (FIG. 8e) at atmospheric pressure to preprocess shelves 702. In this regard, a suitable door configuration is used between front end 12 and loadlock 20, which is not shown since such door configurations are known. It is sufficient to say that this door must be in an open position before the front end robot can enter loadlock 20. FIG. 19h illustrates that lift pins 716 and 718 have been lowered to place preprocess wafers 710 on their respective process stations. Both FIGS. 18e and 19h illustrate slit doors 706 and 708 as closed for the processing mode. It should be appreciated that the relationship between these various events, as well as the actual initiation of processing, may be changed in many suitable ways in timed relation to one another. Processing then proceeds so as to transform the preprocess wafers into postprocess wafers 712 at process stations 26a and 26b.

Referring briefly to FIGS. 1a and 1b, with regard to front end robot 750, it is noted that, while two wafers can be transferred at the same time, the robot readily accommodates the transfer of the 25th wafer in a 25 wafer FOUP singularly by using independent motion of its over/under paddles. Moreover, this robot is inherently flexible in readily accommodating a variety of wafer positions within the FOUPs and cooling station 21, for example, when not all FOUP's come in fully loaded, since one or two wafers are selectively transferred at a time. That is, robot 750 may readily pick one wafer from one FOUP and another wafer from another FOUP, if necessary, using independent paddle motion, in order to enhance system throughput. The converse is likewise true for placing wafers in the FOUPs.

Referring to FIG. 19i, during processing, front end robot 750 places a new pair of preprocess wafers 710 onto preprocess shelves 702. At this time, the postprocess and preprocess shelves of wafer column 700 are all filled.

Referring to FIG. 19j, immediately after placing the new preprocess wafers, front end robot 750 picks postprocess wafers 712 from postprocess shelves 704. It should be appreciated that this movement from dropping off the new preprocess wafers to immediately picking up the postprocess wafers can be executed very quickly, if mandated by a relatively short process time and, therefore, may be referred to as a "fast wafer swap."

In FIG. 19k, the system is ready for the conclusion of processing with empty postprocess shelves 704 and with the new pair of preprocess wafers 710' waiting on preprocess shelves 702. Wafers at the process stations are indicated as transformed to post process wafers.

FIG. 19l, illustrates the conclusion of processing, with the slit doors opened and newly processed wafers 712 raised by lift pins 716 and 718. The next step is essentially identical to that of previously described FIG. 19a such that the processing cycle may repeat as necessary.

Having described system 10 in detail above, as well as its method of operation, at this juncture, is appropriate to discuss certain advantages that it provides, particularly with respect to system throughput in the instance of relatively short processing times. When processing times are short, it is important to effectuate transfer of workpieces in a way that does not add overhead time to the overall time which is required to process a workpiece. That is, overhead time during which workpieces are being transferred without concurrent exposure of workpieces to the treatment process. In this regard, it should be appreciated that system 10 transfers processed workpieces out of the processed chambers simultaneous with transferring new preprocess workpieces to the process chamber. When the processed workpieces arrive at the loadlock, preprocess workpieces simultaneously arrive at the process chamber. Moreover, this transfer is accomplished in a rapid manner. For example, transfer times on the order of less than approximately 8 seconds are contemplated. At the same time, it should be appreciated that the use of a workpiece column in the loadlock provides for what may be referred to as a mini loadlock. That is, the loadlock volume is so limited as to provide for rapid pump down from atmospheric pressure to an intermediate pressure or to the treatment pressure itself. For example, a loadlock volume of approximately 20 liters is contemplated. Loadlock pumpdown times of approximately 10 seconds or less are contemplated.

Referring again to FIG. 3, as mentioned previously, pump down of loadlock 20 is accomplished through ports 87, only one of which is visible in the view of FIG. 3. Since such a rapid pump down is facilitated, at least in part, due to the small volume of the loadlock, is recommended to use as dry an ambient as possible when the loadlock is in communication with the front end. In this way, flash condensation of water vapor may be avoided. Moreover, purge ports 89, only one of which is visible, may be used to present a constant curtain of gas flow when the loadlock is in communication with the front end, to prevent mixing of ambient front end gasses with those gasses that are present in the loadlock. Thus, a pump and purge routine may be used to avoid such gas mixing at any time the door is open between the loadlock and front end, whereby gasses entering through purge ports 89 flow through the loadlock and are immediately evacuated through pump ports 87. This is attended by the further advantage, briefly described above, that contaminants will flow into trough 87 and are evacuated, as a result of pumping from this low lying region of the loadlock.

Figure 20:
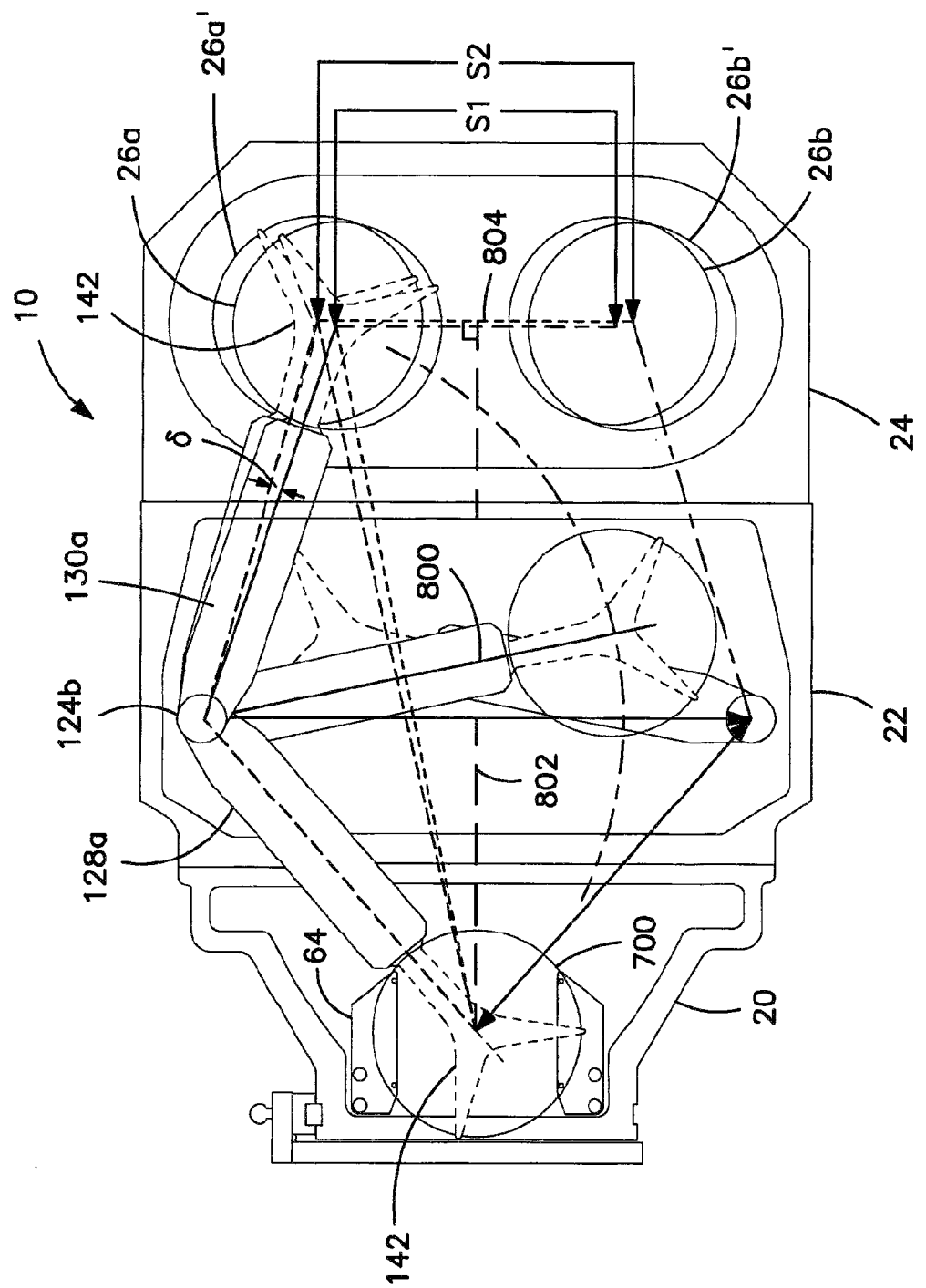
FIG. 20 is a diagrammatic plan view illustrating a process chamber, transfer chamber and loadlock for purposes of describing one way in which variation of process station to process station spacing can be accommodated.

Referring to FIG. 20, system 10 is diagrammatically illustrated without front end 12, in a plan view for purposes of describing a feature which is advantageous with respect to process station spacing. That is, the distance between the center of one process station to the center of the other process station. For purposes of clarity, only swing arm pair 124b has been illustrated, although it is to be understood that the present discussion is equally applicable with respect to the other swing arm pair. It is noted that FIG. 20 diagrammatically illustrates swing arm arrangement 120 with respect to counterrotation, however, its full symmetric movement capabilities are seen, for example, in FIGS. 18a-e. In the present example, process stations 26a and 26b are shown spaced apart by a distance S1. It may be desired, however, to change this spacing, for example, by increasing the spacing such that the spaced apart distance between processing stations 26a' and 26b' is increased to a distance S2. This change is readily accommodated by system 10, as will be described immediately hereinafter.

Turning to FIG. 5a in conjunction with FIG. 20, as described above, it is noted that upper swing arm 128a is clamped to the inner swing arm drive shaft while lower swing arm 130a is pinned or fixedly attached to the outer swing arm drive shaft. In order to accommodate any given process station to process station spacing or change thereof, lower swing arm 130a is initially fully rotated in the direction of the process stations, using motor 310. Housing 176, shown in FIG. 5a, can then be rotated in a way which allows for positioning lowermost swing arm 130a at an associated one of processing stations such as 26a'. Housing 176 is then fixed in position. Having accomplished this positioning and with upper swing arm 128a unclamped from the inner swing arm drive shaft, upper swing arm 128a is freely rotated to its desired position at wafer column 700. The upper swing arm is then clamped to the inner swing arm shaft. As a result of the counter rotation of the upper and lower swing arms, the home position will be angularly displaced by an amount that is equal to one half of the additional rotation that is introduced in the swing arm paths between the wafer column and the respective process stations. In FIG. 20, if the increased rotation is given as an angle δ, the home position of workpiece column 700 will be rotationally displaced by one half δ toward the process stations. Of course, if the swing arm length is changed, the wafer column position will change accordingly. Shelf arrangement 64 can accommodate minor changes in swing arm length, as is. Greater changes, however, will necessitate movement of the shelf position within loadlock 20 along a line 802 that bisects and is normal to a process station to process station 804.

As another advantage of system 10, dual wafer delivery capabilities are provided using only a single wafer load/unload lock style architecture. This provides significantly reduced transfer chamber size and simplifies the mechanics associated with wafer exchange. The loadlock design allows for rapid atmospheric wafer exchanges which are facilitated through the described independent over/under robot paddles of the front end robot. This, in turn, is inherently flexible with small lots often confronted in FOUP based processing. A small volume loadlock allows for fast venting and pumping; imperative to high system throughput capability. Vacuum based transfer couples both the loadlock and process module wafer exchanges into common motions; eliminating the need for additional delays due to sequencing, and minimizing wafer exchange times. A "mini-batch" processing technology can be employed (side-by-side wafer processing), while reducing the physical size and costs associated with wafer handling technology. In this regard, the transfer chamber is also of a relatively small size. As a further advantage, during atmospheric loadlock exchange, two new wafers are placed simultaneously by the front end robot, which then removes the previously processed wafers. This exchange of wafers happens very quickly and, when coupled with fast vent and pump times associated with the reduced loadlock volume, allows for nearly invisible handling overhead. Indeed, the platform's main goal for high throughput capability is to mask all time associated with wafer replenishment entirely within the time required to process the other wafers. The result is thought to be a truly continuous processing capable system. As still a further advantage, the arrangement of opposing dual swing arms provide a trajectory which allows single wafer type load/unload lock architecture to efficiently accommodate side by side wafer processing geometry with a significantly smaller footprint than that embodied by prior designs.

As will be brought to light with reference to a number of specific examples to be described immediately hereinafter, the concepts taught herein may be embodied by a wide variety of alternative system configurations and arrangements, all of which are considered to fall within the scope of the present invention.

Figure 21:
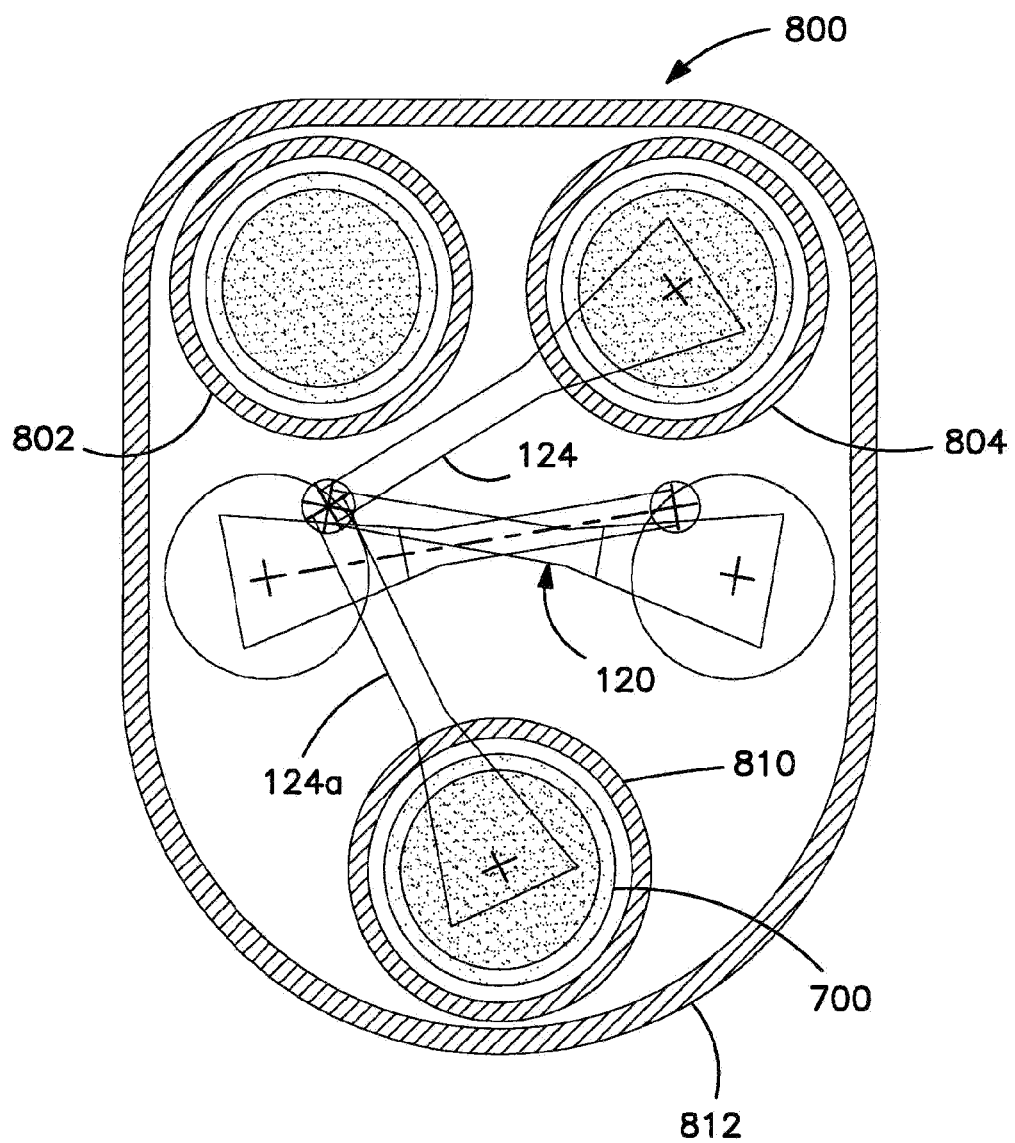
FIG. 21 is a diagrammatic plan view of one embodiment of a system using a swing arm arrangement of the present invention in conjunction with process stations that are housed in individual process chambers.

Attention is immediately directed to FIG. 21 which diagrammatically illustrates a processing arrangement that is generally indicated by the reference number 800. It is noted that FIG. 21 diagrammatically illustrates swing arm arrangement 120 with respect to counterrotation, however, its full symmetric movement capabilities are seen, for example, in FIGS. 18a-e. Processing arrangement 800 includes first and second processing chambers 802 and 804, respectively. This system further includes swing arm arrangement 120 with dual swing arm assemblies 124a and 124b. A loadlock 810 is provided which houses wafer column 700. Processing chambers 802 and 804, along with loadlock 810 are housed within an overall chamber 812. It is noted that any number of valve arrangements may be utilized for interfacing the various chambers utilized by processing arrangement 800 including, for example, one described in FIGS. 3 and 4 of U.S. Pat. No. 6,429,139 that is used in conjunction with arcuate chamber walls. Accordingly, such descriptions will not be repeated herein for purposes of brevity.

Still referring to FIG. 21, it should be appreciated that swing arm arrangements 124a and 124b can move synchronously, as described above, while processing chambers 802 and 804 are both in use. As an alternative, however, one swing arm arrangement can be disabled with respect to its rotational motion, for example, by turning off its rotational drive motor such that the swing arm assembly remains in its home position, while the other swing arm assembly remains fully operational. The disengaged swing arm assembly will continue to move vertically, as it normally would, with the operating swing arm assembly such that there is no interference between the two swing arm assemblies. The particular processing chamber that is associated with the disengaged swing arm assembly may be configured so that its utilities can be isolated from the rest of the system (i.e., turned off) such that the particular processing chamber can be serviced while the other processing chamber remains completely operational. This feature is considered to be highly advantageous, in and by itself.

Figure 22:
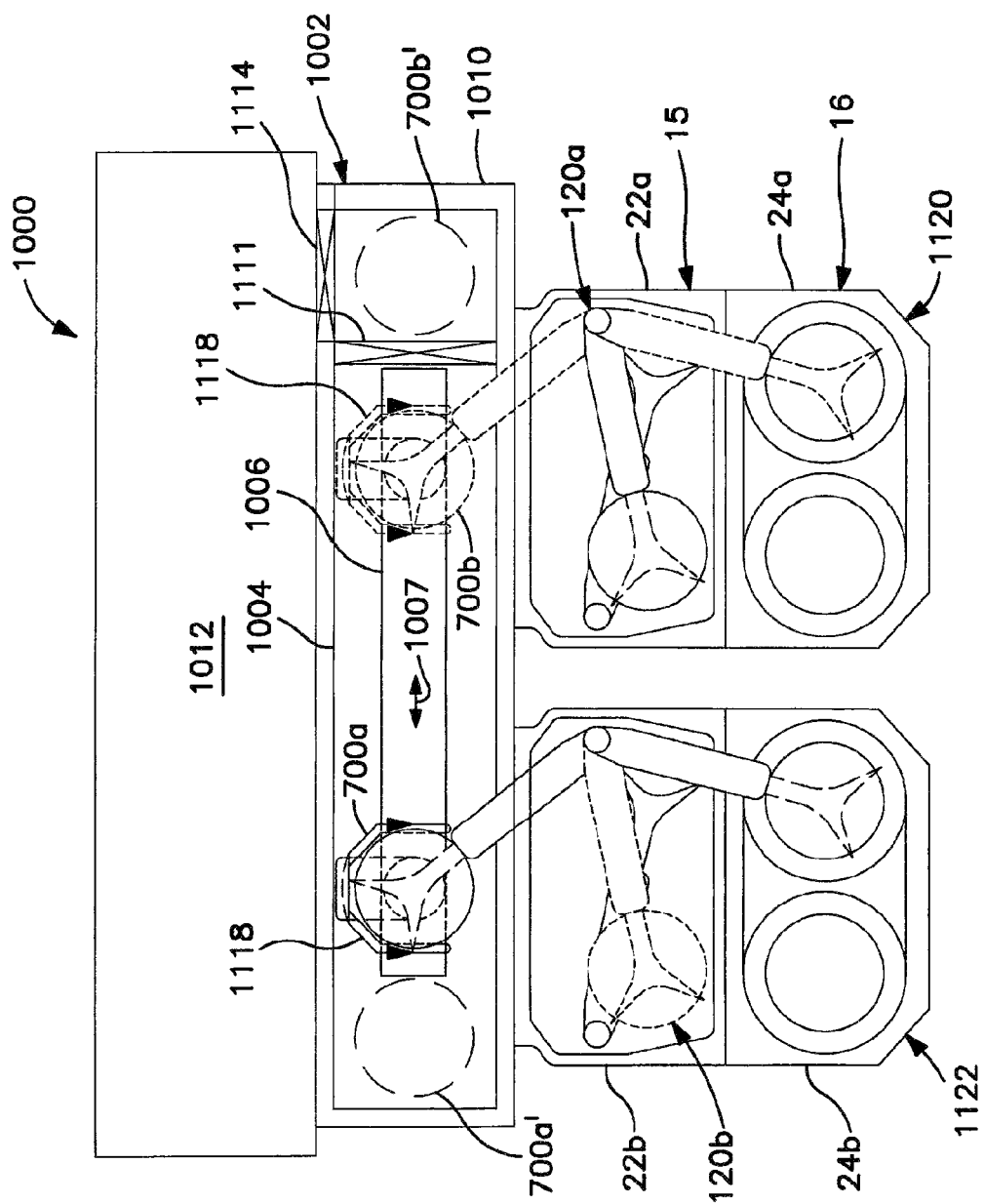
FIG. 22 is a diagrammatic plan view of another embodiment of a system, produced in accordance with the present invention, using a linear workpiece drive and a portable workpiece column.

Referring to FIG. 22, another embodiment of a system, produced in accordance with the present invention, is generally indicated by the reference number 1000. System 1000 shares the advantages of system 10 while providing still further advantages. This system uses wafer handling section 15 and processing section 16 in conjunction with a front end 1002. The latter includes an elongated transport chamber 1004 which houses a transport mechanism 1006 in the form of a linear drive for moving workpieces as indicated by arrow 1007. One suitable form of linear drive comprises a magnetic levitation linear drive, although any suitable type may be employed. A loadlock 1010 is stationed at one end of transport chamber 1004 for communication with the interior of the transport chamber through a door 1111. In this regard, it should be appreciated that transport chamber 1004 can operate at process pressure. Loadlock 1010 is, in turn, configured for communication with an atmospheric mini environment 1012 through a door 1114. Mini environment 1012 is not shown in detail, since its general details of construction will be evident to those having ordinary skill in the art in view of the foregoing discussions, but which may include, for example, a front end robot and ports for any suitable number of FOUPs. Door 1111 and door 1114 may be of any suitable type including, but not limited to slot valves of the type previously described with respect to the FIG. 17 series, depending on the configuration provided for the transport of workpieces therethrough, as will be further described.

Still referring to FIG. 22, in one embodiment, transport mechanism 1006 is configured for moving a workpiece carrier 1118 therealong which supports one or more workpiece columns. Carrier 1118 is shown stationed for access by swing arm arrangement 120b, designated as a workpiece column 700a supported by transport 1006 and, in phantom, designated as a workpiece column 700b. Each of these workpiece columns resembles previously described workpiece column 700 with the difference that each workpiece column is portable, as will be further described. It should be appreciated that carrier 1118 supports previously described shelf arrangement 64 for access by swing arm arrangements 120a and 120b.

Still referring to FIG. 22, when using a portable workpiece carrier, door 1111 may comprise any suitable door arrangement. A front end robot (which may be identical to front end robot 750 of FIG. 18e), forming part of front end 1012, may access the portable workpiece carrier at 700b' through door 1114 in a manner that is essentially identical to that described with respect to system 10 by moving the workpiece carrier to location 700b'. Specifically, the front end robot may have independent over/under paddles that can be used for a four position workpiece column. This location may also include a rotatable shelf arrangement for confronting either door 1114 for front end access or door 1111 for linear transport mechanism 1006 access. Alternatively, door 1114 may be configured for moving an entire workpiece column or workpiece carrier therethrough with the use of appropriate front end robotics. In this way, a fresh, preprocess workpiece column can enter through loadlock 1010 while another loadlock (not shown but at an opposing end of transport 1006) can be used by the front end to retrieve a postprocess workpiece column. Workpiece columns 700a and 700b are shown selectively aligned with transfer chambers 22b and 22a, respectively. It should be appreciated that more than one portable workpiece carrier can be used at a time so that, with workpiece columns 700a and 700b positioned as shown, transfer of workpieces to and from these columns can proceed as described above with respect to system 10. For descriptive purposes, one transfer chamber in combination with one process chamber may be referred to as a process platform. Accordingly, in the present example, process platforms 1120 and 1122 are provided. A workpiece column 700a' comprises a location to which the portable workpiece carrier can be moved, serving, for example, as a cooling and/or buffer station. The buffer/cooling station can be configured to rotate 180 degrees, depending on requirements, for access from linear transport 1006 and wafer carrier 1118. It is noted that this may comprise another loadlock location, as mentioned above, and with appropriate valves, so as to appear essentially the same as loadlock 1010, in order to increase system throughput, if the reduced system overhead time coupled with process time requirements warrants such a feature. Accordingly, the advantages that are attributable to the use of a stationary workpiece column in the loadlock are also provided by system 1000, while still further advantages are provided through making this workpiece column portable. Moreover, when process chamber 24a is used to practice a different process than process chamber 24b, the configuration of system 1000 provides the further advantage of allowing for sequential processing, without the need to break vacuum.

Figure 23:
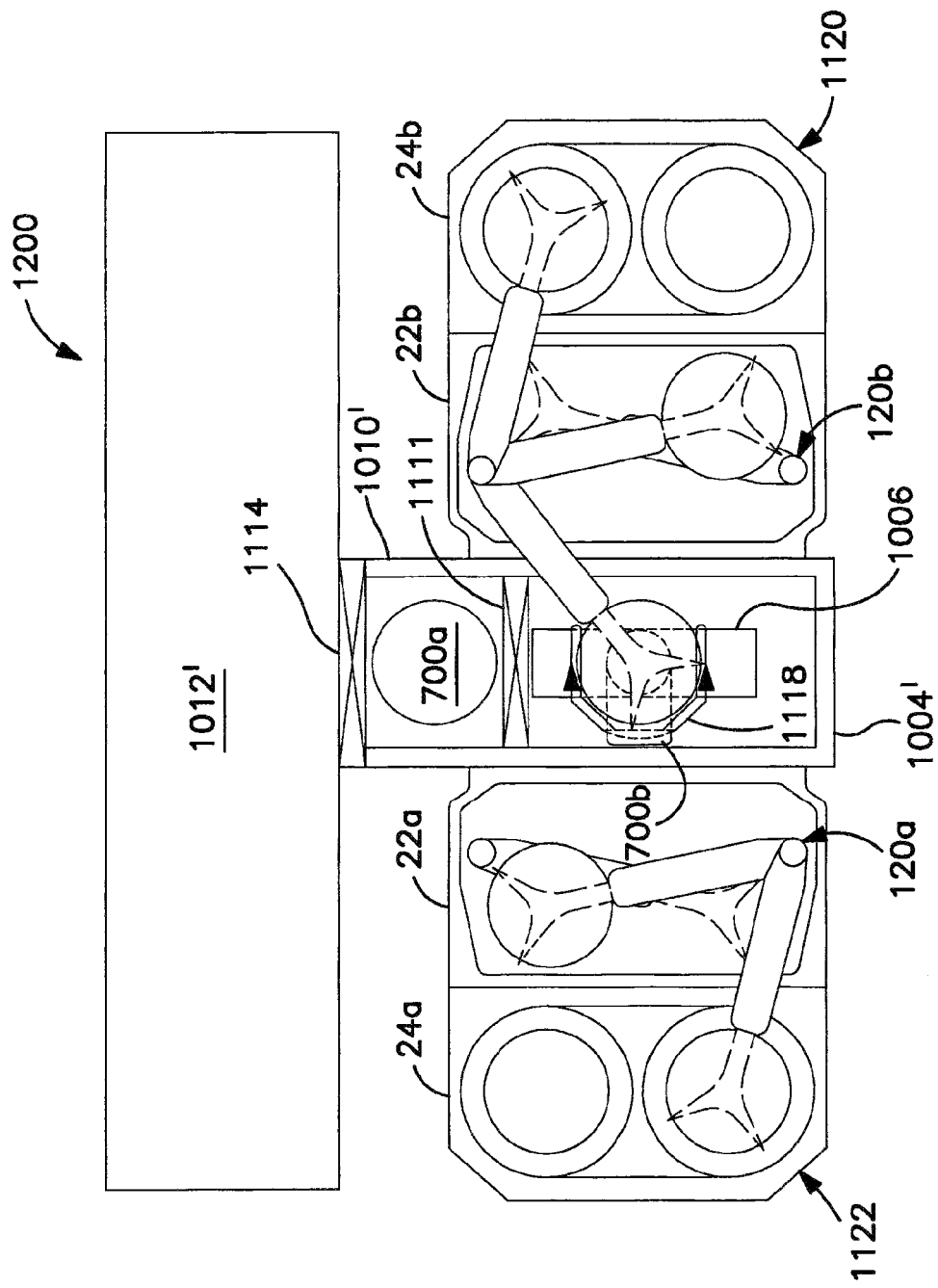
FIG. 23 is a diagrammatic plan view of an alternative embodiment of a system, produced in accordance with the present invention, using a linear workpiece drive.

Turning now to FIG. 23, another embodiment of a system, produced in accordance with the present invention is generally indicated by the reference number 1200. It is noted that, throughout appropriate ones of the remaining figures, swing arm arrangement 120 is illustrated with respect to counterrotation, however, its full symmetric movement capabilities are described in detail above and can be seen, for example, in FIGS. 18a-e. System 1200 includes a modified front end 1012' having a loadlock access door 1114 centered on one side thereof. A modified transport chamber 1004' includes a modified loadlock 1010' having doors 1114 and 1111 arranged on opposing sides thereof so as to confront front end 1012' and transport chamber 1004', respectively. Workpiece column 700a is illustrated in loadlock 1010' such that it can be accessed from the front end using the front end robot, or it can be moved into transport chamber 1004'. Workpiece column 700b and carrier 1118 are illustrated in an aligned position with process platforms 1120 and 1122. In this configuration, either process platform can move workpieces to and from this workpiece column using swing arm arrangements 120a and 120b. A cooling and/or buffer station (see FIG. 22, can readily be provided. In one implementation, a suitable arrangement may be provided for elevating a workpiece column, for example, from loadlock 1010' or from a cooling/buffer station such that multiple workpiece columns can be arranged in a stacked relationship. In this regard, a "second story" can be added to transport chamber 1004' and to loadlock 1010' to provide for a high degree of flexibility with respect to movement of workpiece column carriers in this system. It should be noted that system 1200 is also advantageous with respect to providing the capability for performing sequential processing steps without the need to break vacuum. That is, as is also the case with system 1000 and other systems yet to be described, platform 1120 may be used to execute a first process step. After having been exposed to this first process step, workpieces may then be transported to platform 1122 for exposure to a second process step.

Figures 24A, 24B, 24C, 24D:
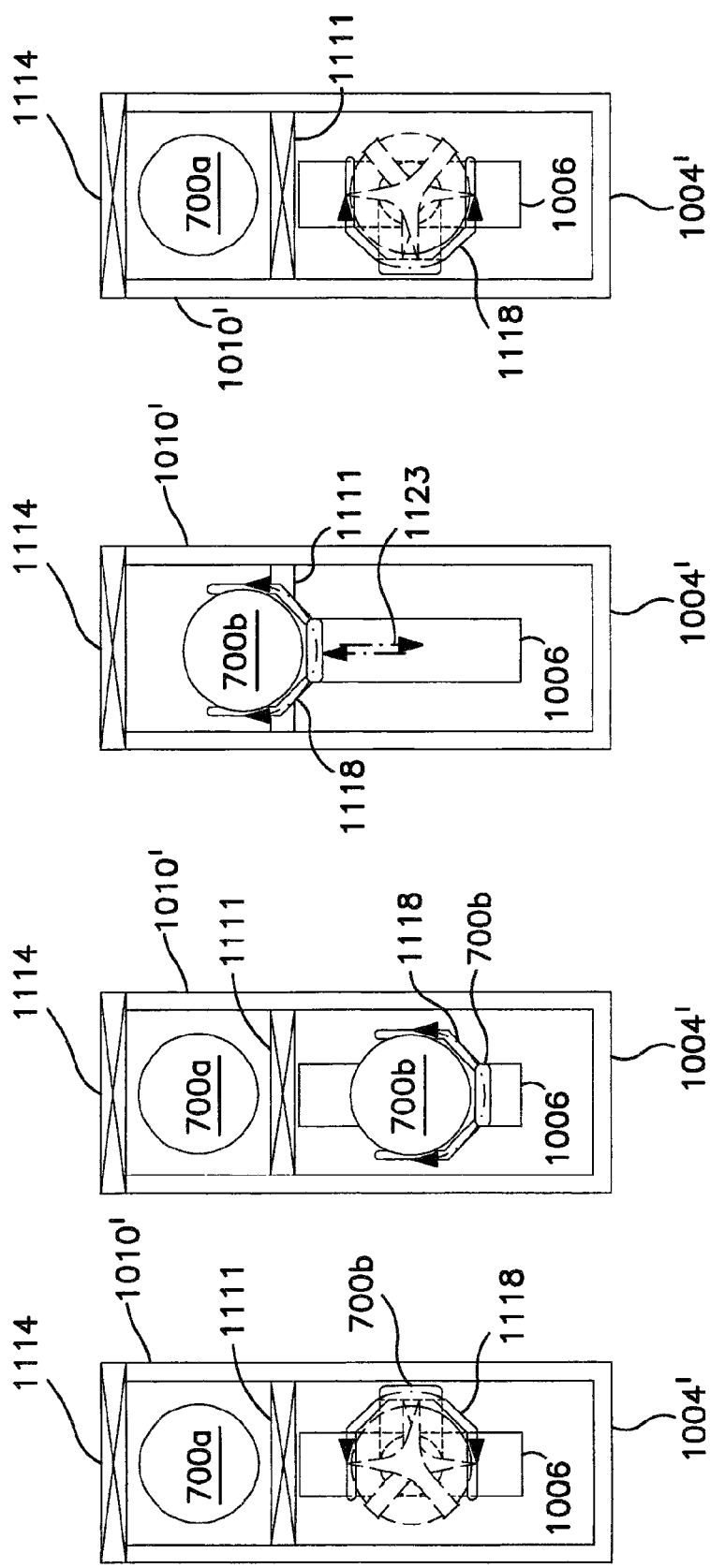
FIGS. 24a-d are diagrammatic plan views of the linear drive and loadlock of the system of FIG. 23, shown here to illustrate workpiece movement using a rotatable workpiece carrier.

Referring to FIGS. 24a-d in conjunction with FIG. 23, further details will now be provided with respect to linear transport 1006, as shown in FIG. 23, although it is to be understood that these concepts can apply to any linear transport and/or rotatable wafer column used herein. FIG. 24a illustrates workpiece carrier 1118, which may itself be a robot with rotation and extension capability, supported by linear transport 1006 rotated to confront platform 1122 to receive/handoff workpieces with this platform.

FIG. 24b illustrates workpiece carrier 1118 rotated to a "neutral" position, in preparation for exchanging workpieces with loadlock 1010'.

In FIG. 24c, workpiece carrier 1118 is moving wafer column 700b into loadlock 1010' for access by front end 1012' of FIG. 23 with door 1111 in an open position. It is noted that linear movement is facilitated, as indicated by arrows 1123.

FIG. 24d illustrates workpiece carrier 1118 rotated to confront platform 1120 (FIG. 23) to receive/handoff workpieces with this platform.

Figure 25:
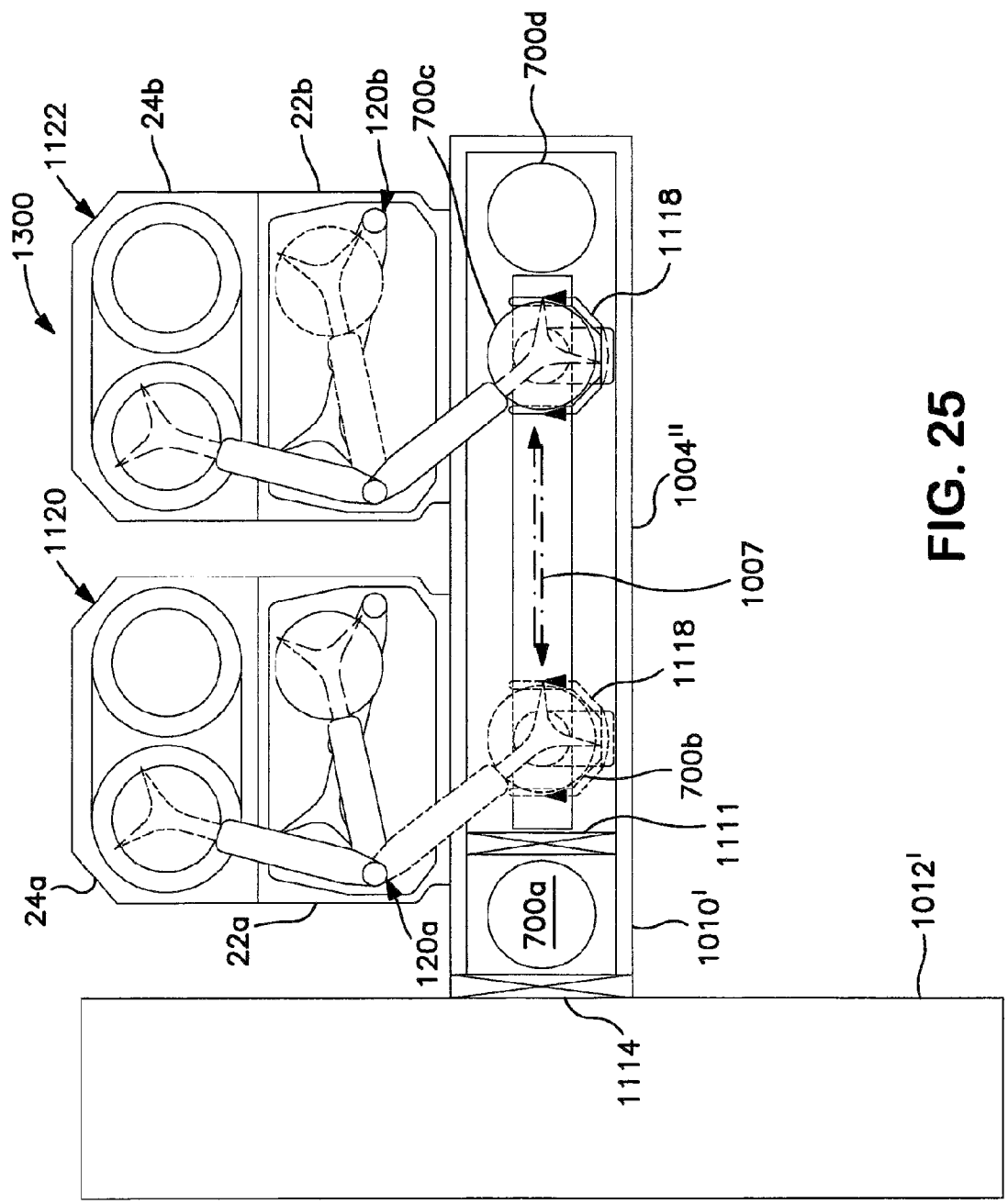
FIGS. 25-27 are plan views of additional alternative embodiments of systems that are produced in accordance with the present invention.

Turning now to FIG. 25, attention is directed to still another alternative system configuration that is generally indicated by the reference number 1300. It should be appreciated that much of the foregoing discussion with respect to alternative embodiments is equally applicable with respect to system 1300. For this reason, some details will not be repeated for purposes of brevity. System 1300 places processing platforms 1120 and 1122 in a side-by-side relationship for access using a transport chamber 1004", in a manner that is similar to that of previously described system 1000. In this case, however, front end 1012' has been rotated 90° and arranged for communication with loadlock 1010' through a door 1114. As illustrated, workpiece columns 700a-700d can be used in the system. Workpiece column 700a is stationed in loadlock 1010', workpiece column 700b is stationed for access by platform 1120, workpiece column 700c is stationed for access by platform 1122 and workpiece column 700d is positioned outward of workpiece column 700c at what may be a cooling and/or buffer station. Workpiece carrier 1118 is shown supporting workpiece column 700c and, in phantom, supporting workpiece column 700a. Again, sequential processing may be performed without the need to break vacuum.

Figure 26:
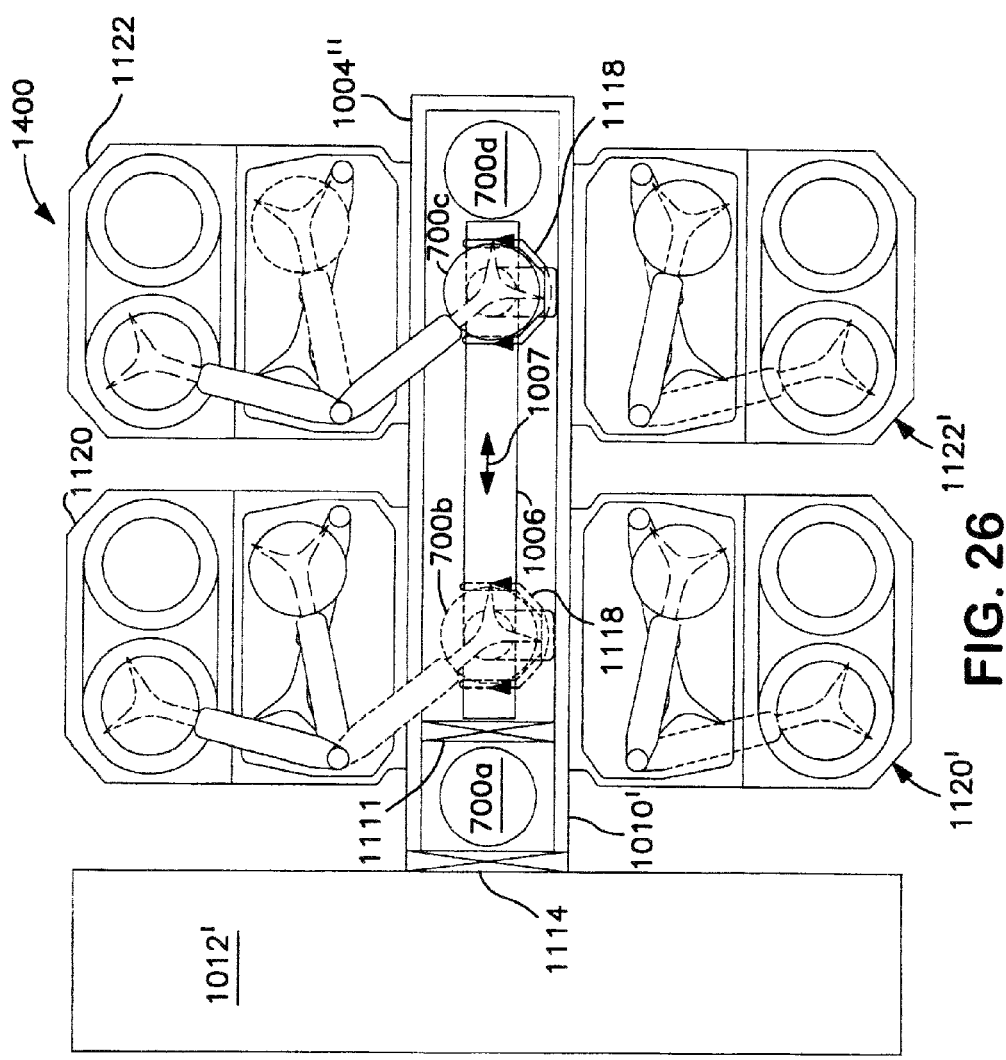

Referring to FIG. 26, yet another alternative system configuration is generally indicated by the reference number 1400. System 1400 represents a combination of previously described systems 1200 and 1300. Specifically, transport chamber 1004", of FIG. 25, has been utilized with platforms 1120 and 1122 positioned side-by-side on one side of the transport chamber, while, on the other side of the transport chamber, platforms 1120' and 1122' are stationed side-by-side in a confronting relationship with the platforms on the opposite side of the transport chamber. Accordingly, system 1400 shares all of the advantages of systems 1200 and 1300 so as to provide for robust workpiece processing capabilities.

Figure 27:
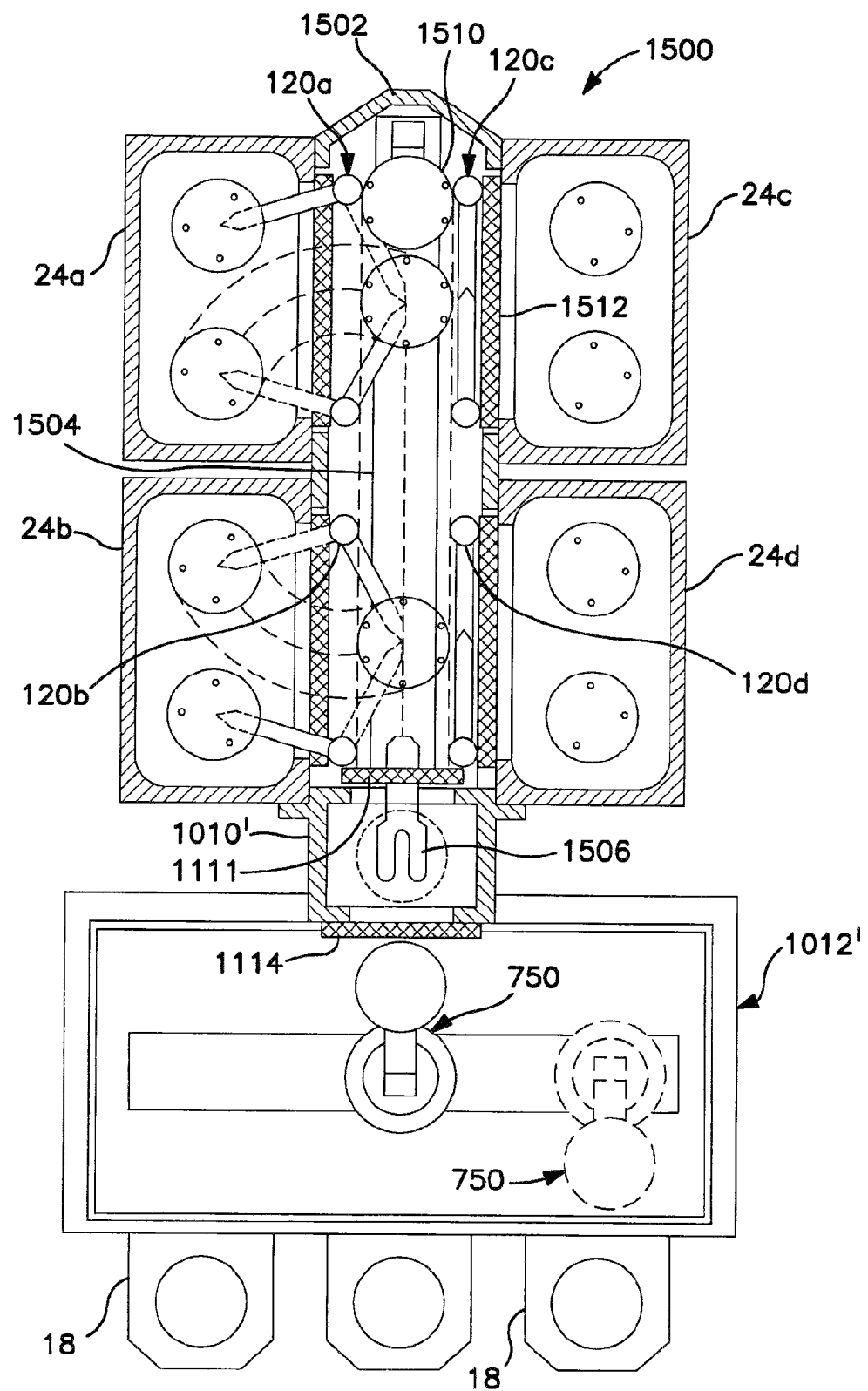

With reference to FIG. 27, an additional alternative system configuration is generally indicated by the reference number 1500. System 1500 shares a number of aspects of its configuration with system 1400 of FIG. 26, with exceptions to be noted. In the present example, a transport chamber 1502 houses a linear drive 1504 in the form of a mini robot. The latter includes a paddle assembly 1506 which may be configured with over/under paddles, as described above, for purposes of transporting one or two workpieces at a time. A paddle assembly of linear drive 1504 is shown at a lower position, in the present view, such that its paddle blades are positioned within loadlock 1010'. A buffer station 1510 is located at the uppermost end of the linear drive, in the present example. The buffer station may include, for example, from 1-30 workpiece positions. Some of the workpiece buffer positions can be used to store test workpieces for process set up and/or calibration. It is of interest to note that the pivot axes of swing arm arrangements 120a-120d are now located in transport chamber 1502. Further, the transport chamber may be held at process pressure, if so desired. Slit doors 1512 (only one of which is identified) are provided which may utilize any suitable valve arrangement such as, for example, valve arrangement 80, as described above. Accordingly, as is the case with other systems described above, sequential or parallel processing can be accomplished using this system.

Still referring to FIG. 27, in one modification of system 1500, loadlock 1010' is not required. That is, door 1111 can be eliminated such that the illustrated loadlock volume becomes part of the transport chamber. Thus, this lower illustrated position of mini robot 1506 can server as a buffer station or for other appropriate purposes. It should be appreciated that the present invention contemplates system configurations that are driven by process parameters. In particular, a small volume loadlock is highly advantageous in the instance of a fast process time, wherein a fast process time would be less than or on the order of a given overhead time required to transport one or more workpieces, including pumping times. On the other hand, slow process times may serve to eliminate the need for a loadlock, whereby configurations such as is illustrated in FIG. 27 become useful. That is, a slow process time is of a length which is generally longer than the time period that is required for wafer transport. In this sense, there is no overhead time, if the latter is viewed as time devoted to wafer transport while a processing station is inactive.

Figure 28:
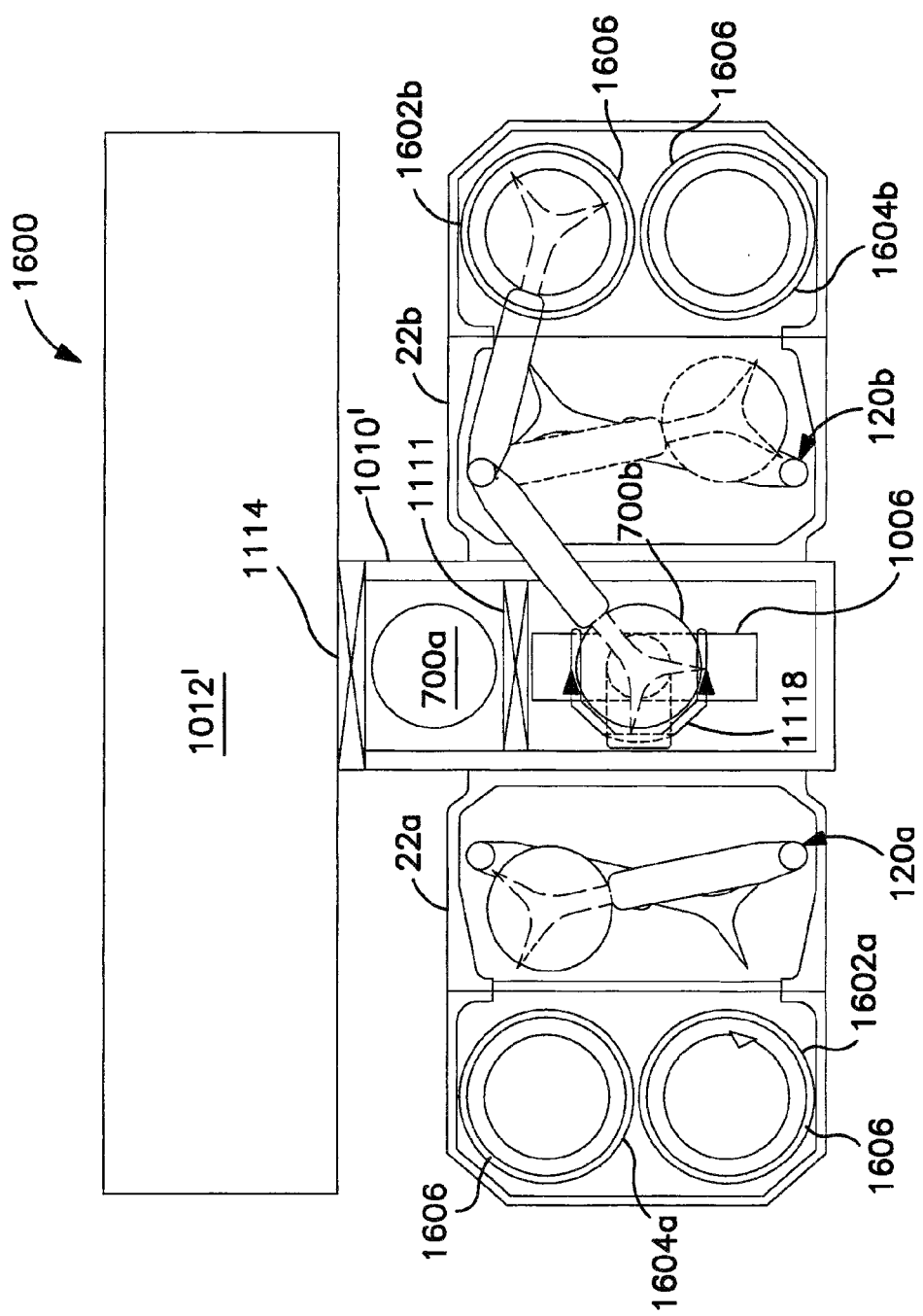
FIG. 28 is a diagrammatic plan view of another embodiment of a system using a swing arm arrangement of the present invention in conjunction with process stations that are housed in individual process chambers.

Turning now to FIG. 28, a further embodiment of a system that is configured in accordance with the present invention is generally indicated by the reference number 1600. It is noted that system 1600 includes an overall configuration which resembles system 1200 of FIG. 23, described above. Accordingly, the present discussion will be limited to certain differences between these two systems. In particular, the side-by-side common processing environment of FIG. 23 has been replaced by a pair of separate processing chambers 1602 and 1604, designated with "a" and "b" appended in the Figure. Each of these chambers is capable of performing a process that is isolated from the other chamber. Thus, a first process can be performed in chamber 1602 while a second process is performed in chamber 1604 in a sequential processing environment, although this is not a requirement. Accordingly, each of the process chambers is located within the transfer chamber and is isolatable therefrom, for example, using a vertically movable process chamber slit door 1606, as described in above incorporated U.S. Pat. No. 6,429,139. It should be noted that this embodiment shares advantages with the embodiment of FIG. 21. In particular, one process chamber, and associated, swing arm arrangement can continue to operate while the other process chamber undergoes servicing or maintenance.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein.

What is claimed is:

1. In a system for using a first, driven shaft to rotationally drive a second shaft, a configuration comprising:
    first and second toothed flexible closed-loop members; and
    a first pulley arrangement mounted on said first shaft and a second pulley arrangement mounted on said second shaft for receiving the first and second toothed flexible members in a side-by-side relationship such that at least a particular one of the pulley arrangements includes a first pulley engaging the first toothed flexible member and a second pulley engaging the second toothed flexible member, each of the first and second pulleys having a tooth receiving configuration which cooperates with said first and second toothed flexible members to provide a given backlash clearance when engaged with the first and second toothed belt members, respectively, and said first pulley and said second pulley are mounted with a rotational offset therebetween such that the tooth receiving configuration of the first pulley is rotationally offset with respect to the tooth receiving configuration of the second pulley, based on said given backlash clearance, in a way which limits an operational backlash of the particular pulley arrangement with respect to movement of the first and the second toothed flexible members to a value that is less than the given backlash clearance.

2. The configuration of claim 1 wherein said system is configured for processing workpieces and wherein said first shaft is driven by a motor and said second shaft is used to drive at least one swing arm for use in moving workpieces within said system.

3. The configuration of claim 1 wherein said first and second toothed flexible members are flexible belts.

4. In a system for using a first, driven shaft to rotationally drive a second shaft, a method comprising:
    providing first and second toothed flexible closed-loop members; and
    mounting a first pulley arrangement on said first shaft and a second pulley arrangement on said second shaft for receiving the first and second toothed flexible members in a side-by-side relationship such that at least a particular one of the pulley arrangements includes a first pulley engaging the first toothed flexible member and a second pulley engaging the second toothed flexible member, each of the first and second pulleys having a tooth receiving configuration which cooperates with said first and second toothed flexible members to provide a given backlash clearance when engaged with the first and second toothed belt members, respectively, and said first pulley and said second pulley are mounted with a rotational offset therebetween such that the tooth receiving configuration of the first pulley is rotationally offset with respect to the tooth receiving configuration of the second pulley, based on said given backlash clearance, in a way which limits an operational backlash of the particular pulley arrangement with respect to movement of the first and the second toothed flexible members to a value that is less than the given backlash clearance.

5. The method of claim 4 wherein said system is configured for processing workpieces and wherein said first shaft is driven by a motor and said method includes using said second shaft to drive a swing arm for use in moving workpieces within said system.

6. The method of claim 5 wherein said first and second toothed flexible members are flexible belts.

* * * * *